United States Patent
Watanabe

(10) Patent No.: US 7,705,393 B2
(45) Date of Patent: Apr. 27, 2010

(54) NONVOLATILE SEMICONDUCTOR STORAGE DEVICE HAVING SILICIDE IN CONTROL GATE ELECTRODE

(75) Inventor: Shoichi Watanabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/756,200

(22) Filed: May 31, 2007

(65) Prior Publication Data
US 2007/0278560 A1 Dec. 6, 2007

(30) Foreign Application Priority Data
May 31, 2006 (JP) .............................. 2006-151540

(51) Int. Cl.
*H01L 21/8234* (2006.01)
*H01L 29/788* (2006.01)
(52) U.S. Cl. .................. 257/315; 257/314; 257/350; 257/368; 438/264; 365/185.2
(58) Field of Classification Search ......... 257/314–315, 257/350, 368; 365/185.2; 438/264
See application file for complete search history.

(56) References Cited

U.S. PATENT DOCUMENTS 6,521,941 B2    2/2003  Park et al.
6,730,566 B2 *  5/2004  Niimi et al. ................. 438/275
7,122,430 B2   10/2006  Sato et al.
2002/0036317 A1* 3/2002 Matsui et al. ............... 257/315
2004/0041202 A1  3/2004  Kim et al.
2005/0041477 A1* 2/2005  Lee et al. ................ 365/185.29
2005/0157549 A1* 7/2005  Mokhlesi et al. ........ 365/185.01
2006/0097307 A1* 5/2006  Sato et al. .................... 257/315

FOREIGN PATENT DOCUMENTS

JP    2000-183043    6/2000

* cited by examiner

*Primary Examiner*—Steven Loke
*Assistant Examiner*—Suberr Chi
(74) *Attorney, Agent, or Firm*—Oblon, Spivak, McClelland, Maier & Neustadt, L.L.P.

(57) ABSTRACT

A nonvolatile semiconductor storage device includes a semiconductor substrate, and at least one memory cell formed on the semiconductor substrate, the at least one memory cell having a gate electrode unit in which a floating gate electrode and a control gate electrode are stacked, at least part of the control gate electrode being silicidated. The nonvolatile semiconductor storage device further includes at least one dummy transistor formed on the semiconductor substrate, the at least one dummy transistor having a first dummy electrode, and a second dummy electrode which has a current leakage path and which is stacked on the first dummy electrode.

11 Claims, 14 Drawing Sheets

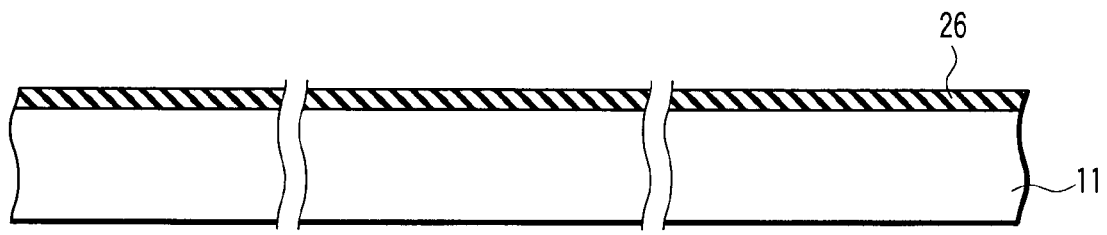
F I G. 2
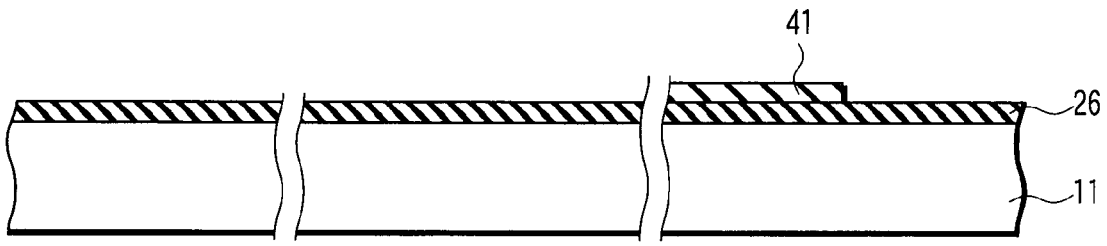
F I G. 3
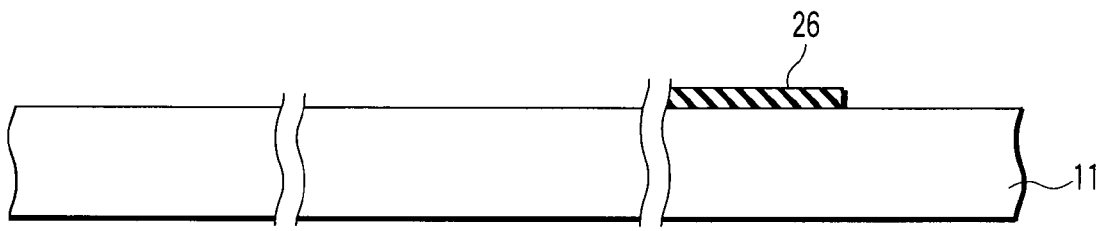
F I G. 4
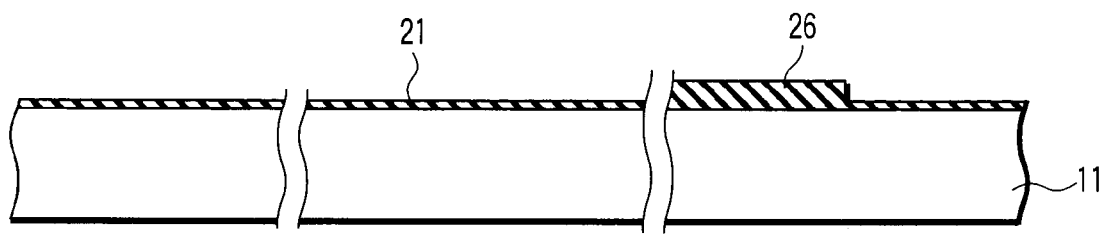
F I G. 5
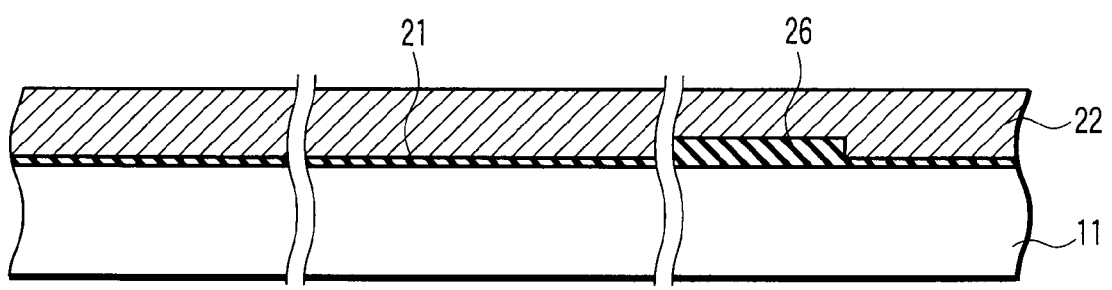
F I G. 6

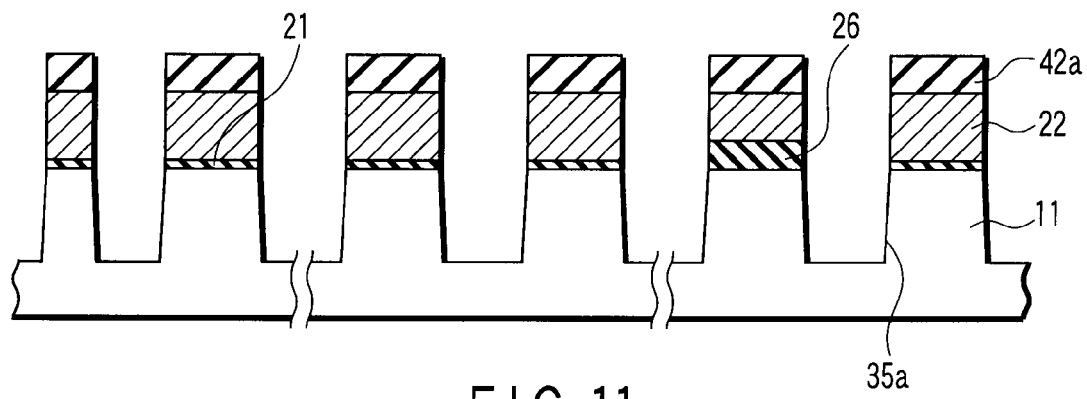
F I G. 11
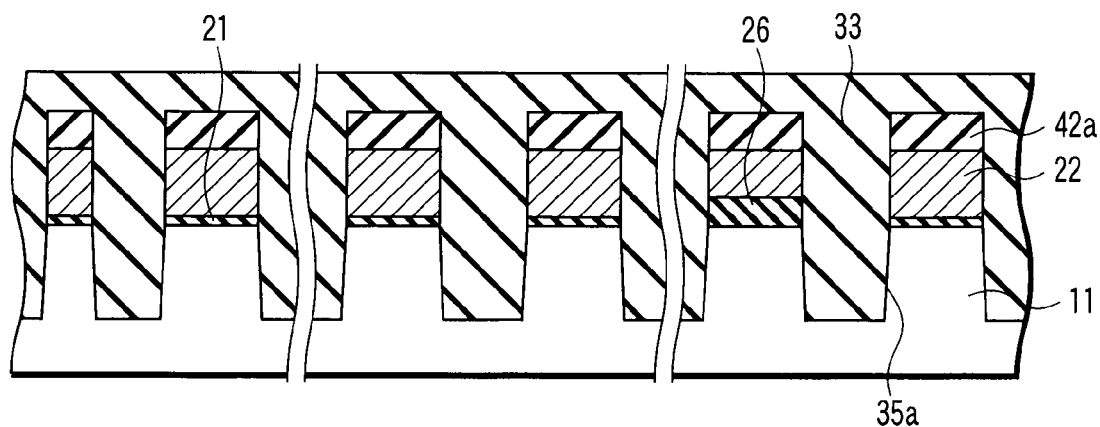
F I G. 12
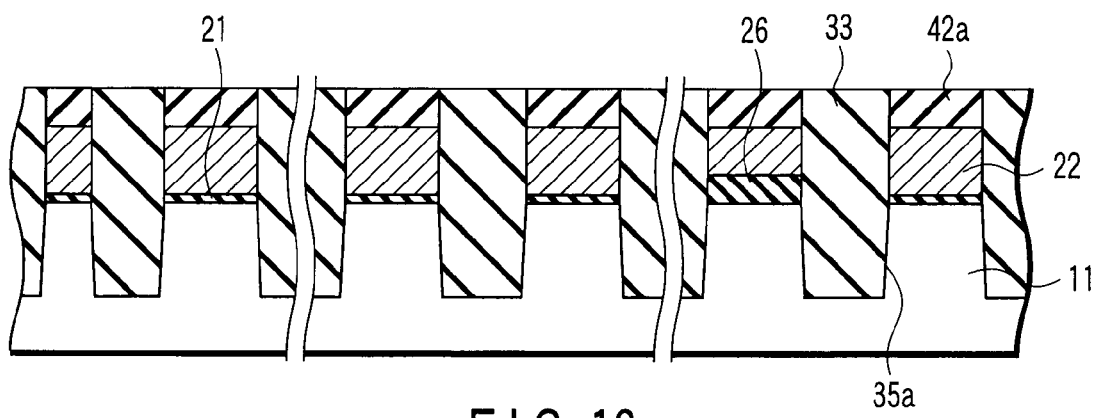
F I G. 13

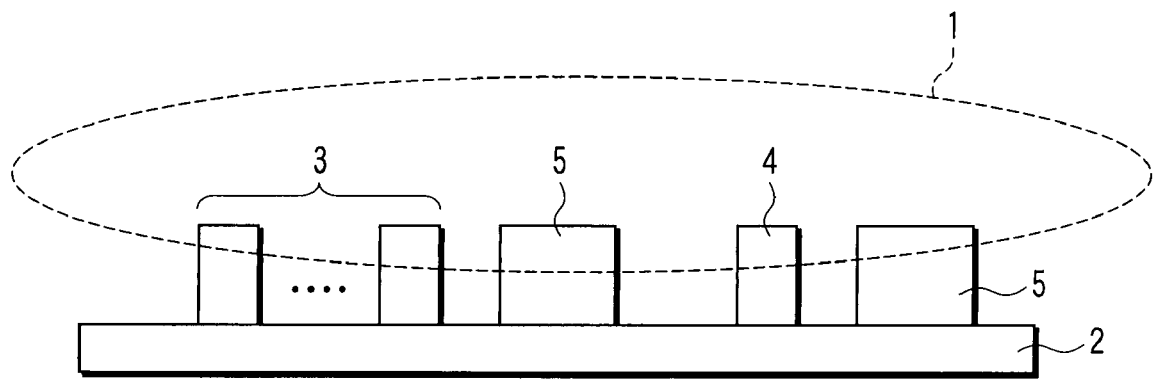
F I G. 20A
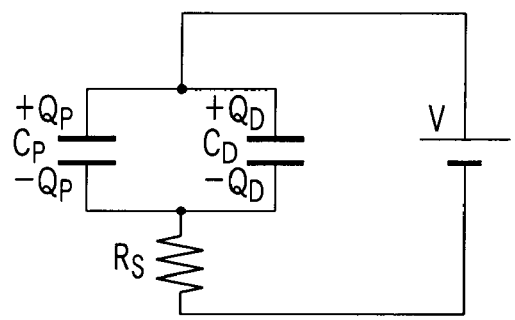
F I G. 20B
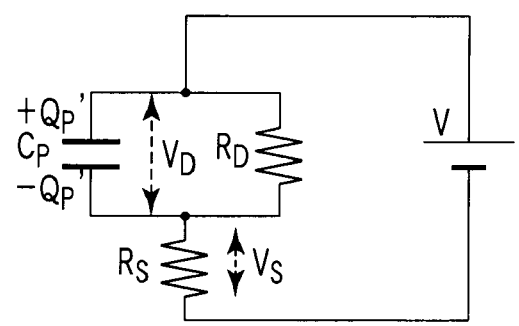
F I G. 20C

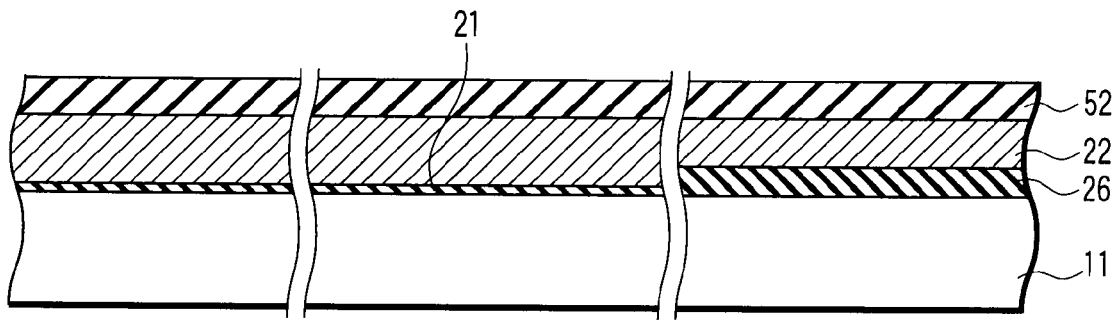
F I G. 27
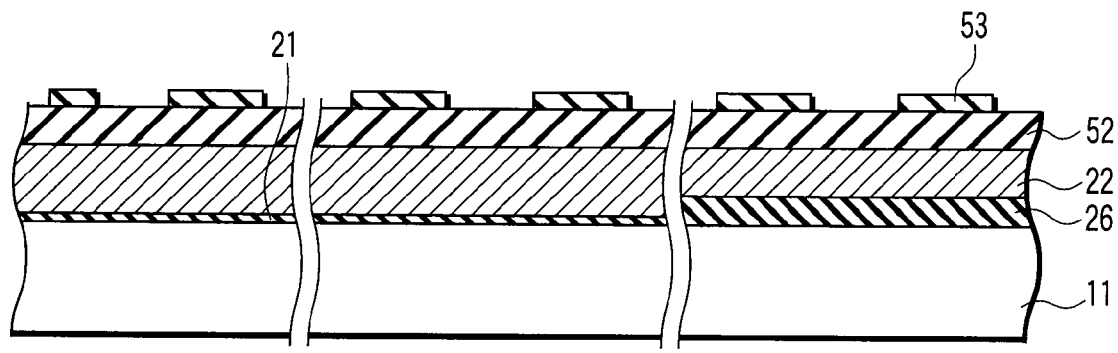
F I G. 28
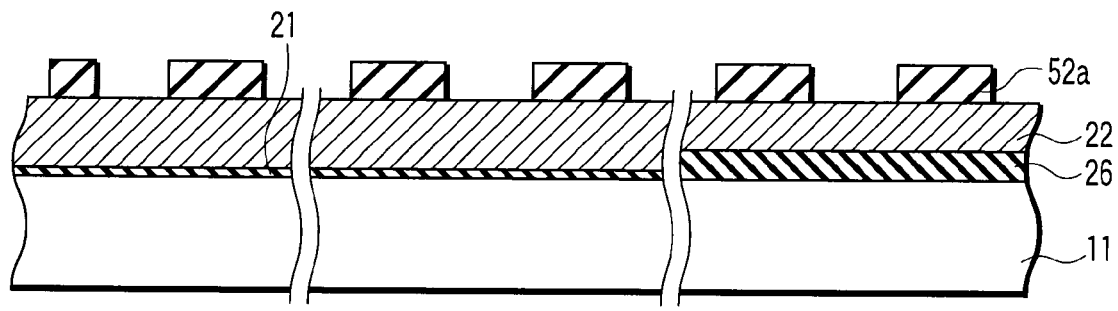
F I G. 29
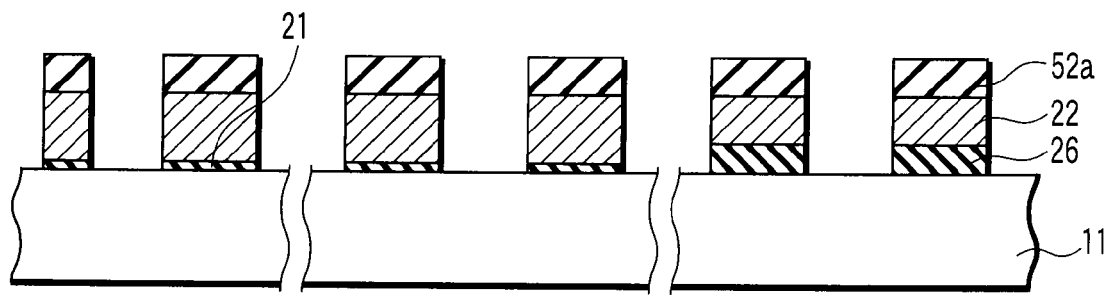
F I G. 30

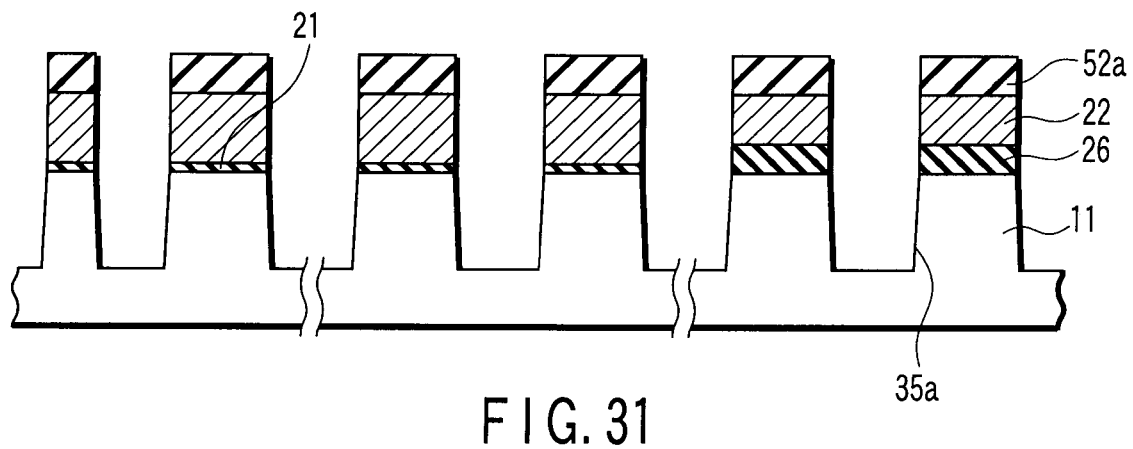
F I G. 31
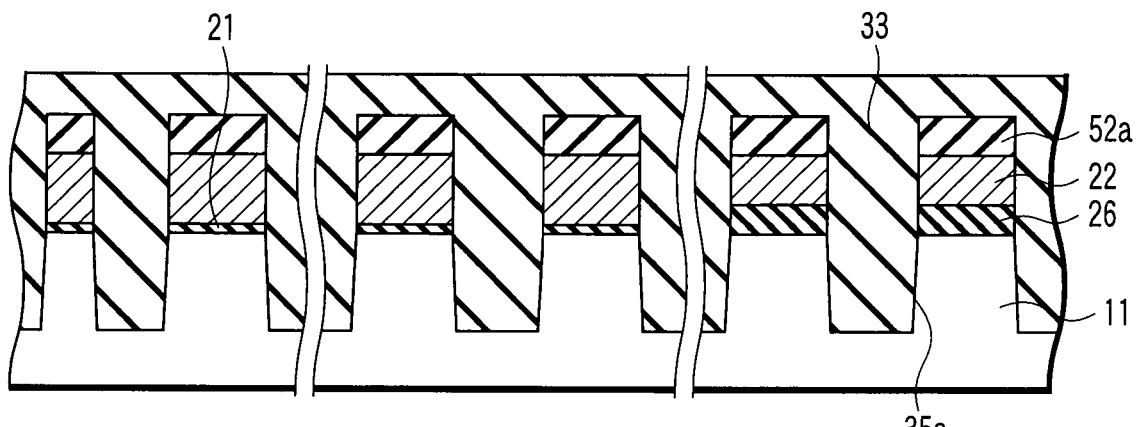
F I G. 32
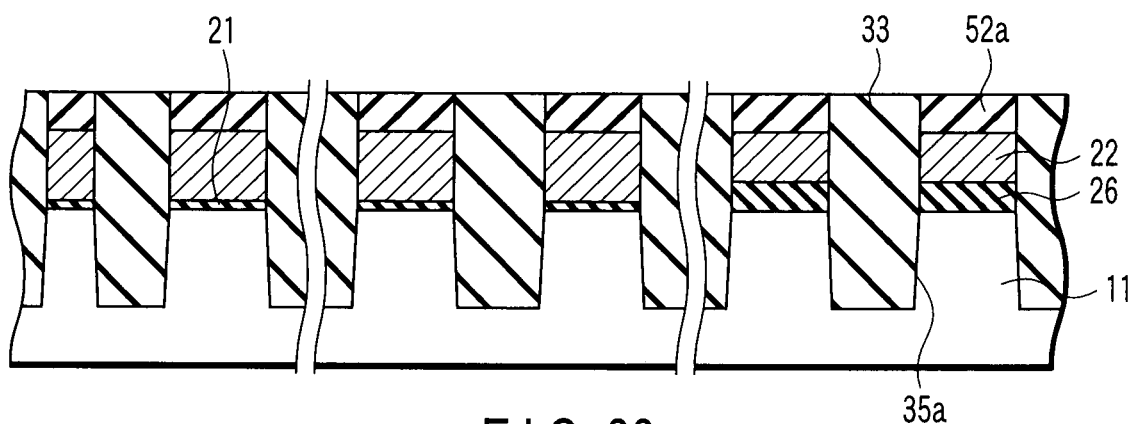
F I G. 33

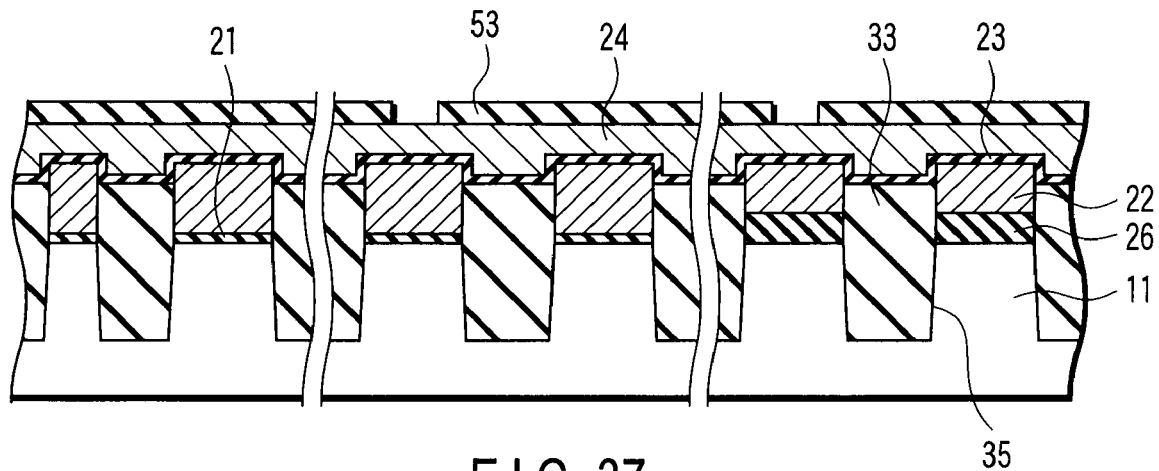
F I G. 37
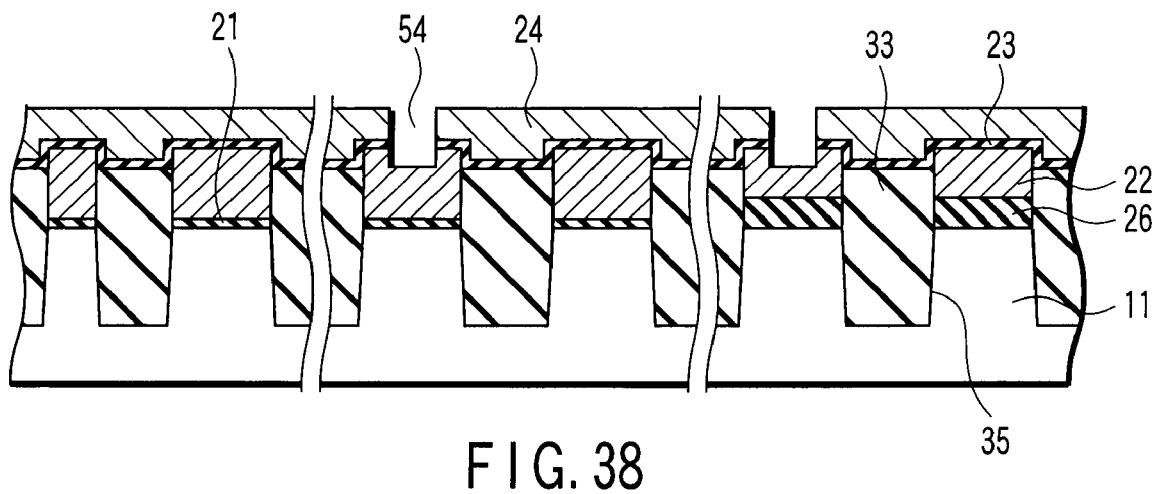
F I G. 38
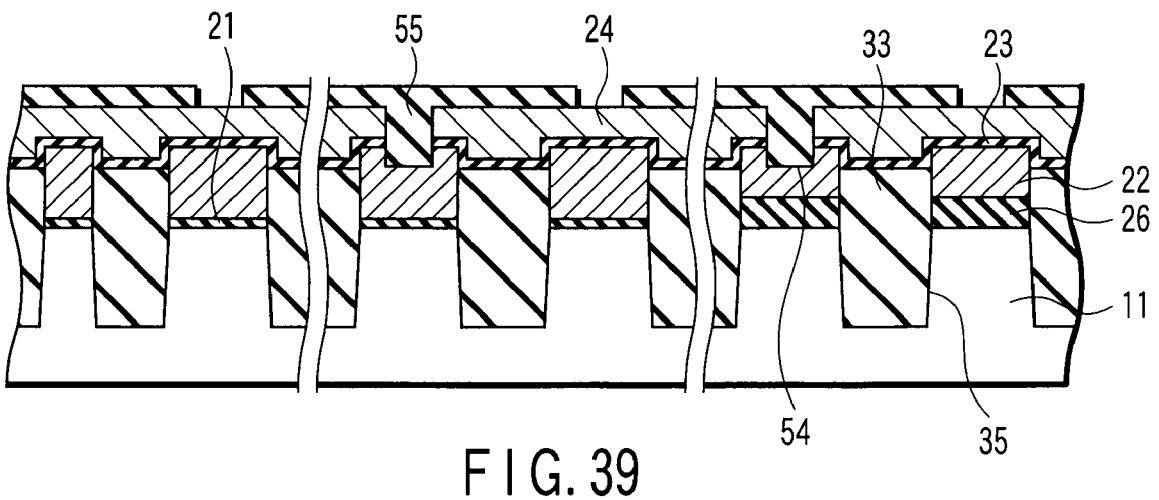
F I G. 39

NONVOLATILE SEMICONDUCTOR STORAGE DEVICE HAVING SILICIDE IN CONTROL GATE ELECTRODE

CROSS-REFERENCE TO RELATED APPLICATIONS

This application is based upon and claims the benefit of priority from prior Japanese Patent Application No. 2006-151540, filed May 31, 2006, the entire contents of which are incorporated herein by reference.

BACKGROUND OF THE INVENTION

1. Field of the Invention

The present invention relates to a nonvolatile semiconductor storage device. More particularly, it relates to an electrically erasable programmable read only memory (EEPROM) in which data can be electrically rewritten.

2. Description of the Related Art

As is well known, there are roughly two kinds of transistor elements in an EEPROM. One is a transistor element (hereinafter, a cell transistor) provided in a memory cell unit. The cell transistor has a gate electrode structure in which a tunnel oxide film, a floating gate electrode, an interpoly insulating film and a control gate electrode are stacked from bottom to top in this order on a substrate. This cell transistor keeps data nonvolatile by a difference of a threshold value which changes depending on whether or not the floating gate electrode is charged. The other transistor element is a peripheral transistor provided in a peripheral circuit unit. The peripheral transistor has the same gate electrode structure as that of the cell transistor except for the interpoly insulating film. That is, the peripheral transistor has a metal insulator semiconductor field effect transistor (MISFET) structure in which the interpoly insulating film is partly or entirely opened so that a control gate electrode is electrically connected to a floating gate electrode. Moreover, the peripheral transistor is classified into two kinds of peripheral transistors having a thick gate oxide film and a thin gate oxide film, depending on the level of drive voltages. A peripheral transistor having a thick gate oxide film is called a high voltage transistor, while a peripheral transistor having a thin gate oxide film is called a low voltage transistor. This peripheral transistor is mainly used to construct a logic circuit.

In the case of the EEPROM, it is desirable that the resistance of the control gate electrode in the transistor be lower in terms of the suppression of RC delay. Polysilicon doped with impurities and thus having conductivity has been used for the control gate electrode. However, along with increasing demands for a higher velocity in the EEPROM, silicide generally lower in resistance than polysilicon is increasingly used to form the control gate electrode. Silicide is formed by heating a reacting species metal after depositing it on polysilicon, and then causing a reaction between polysilicon and the metal. However, silicide is generally more resistant to an etching gas and a drug solution for dry etching than polysilicon, and is more difficult to process than polysilicon. Therefore, when silicide is used to form the control gate electrode, a control gate film is first formed by polysilicon. Then, polysilicon is processed into a control gate electrode pattern and then silicidated.

Here, a silicon nitride film is generally used as a hard mask for the formation of the control gate electrode pattern. The reason is that a resist for lithography alone is not sufficient as a protective film during processing.

In general, the silicon nitride film used for the processing of the control gate electrode pattern remains unremoved even after the processing of the control gate electrode pattern. Further, after the processing of the control gate electrode pattern, a barrier nitride film for preventing the diffusion of impurities from an insulating film between the control gate electrodes to the cell transistor and the peripheral transistor, and a silicon nitride film serving as a stopper in the processing of contacts are again stacked on the control gate electrode pattern. That is, for the silicidation of the control gate electrode pattern, the silicon nitride film on the control gate electrode pattern has to be once removed to expose polysilicon. The dry etching is generally used to remove the silicon nitride film.

However, a charge (electrons and holes) in plasma attempts to enter the cell transistor and the peripheral transistor during the etching since the dry etching is usually carried out in plasma atmosphere. The silicon nitride film is resistant to the entrance of the charge, but polysilicon is not resistant thereto. Moreover, the silicon nitride film has a certain degree of variation in thickness. Therefore, if the etching is carried out for sufficient time to completely remove the entire silicon nitride film on the control gate electrode pattern, polysilicon is exposed in parts where the silicon nitride film is thin. Exposed polysilicon is subjected to plasma, and the charge enters polysilicon. The charge that has entered is trapped in the interpoly insulating film of the cell transistor and in the gate oxide film of the peripheral transistor, which induces variation of the threshold value corresponding to the trapped charge. This varies the threshold values of the cell transistor and the peripheral transistor, and causes a decrease in the reliability of the EEPROM.

In this manner, the reduction of charge accumulation (charge-up) due to the dry etching is required for the improvement of the reliability of the EEPROM having silicide in the control gate electrode.

In addition, in order to prevent charging damage, there has been already proposed a device having a configuration in which a dummy wiring line that is not used for circuit operation is provided in a MIS transistor formation area having a thick gate insulating film (e.g., refer to Jpn. Pat. Appln. KOKAI Publication No. 2000-183043). However, this proposal has a problem that the number of manufacturing processes and the area of a device tend to increase.

BRIEF SUMMARY OF THE INVENTION

According to a first aspect of the present invention, there is provided a nonvolatile semiconductor storage device comprising:

a semiconductor substrate;

at least one memory cell formed on the semiconductor substrate, and having a gate electrode unit in which a floating gate electrode and a control gate electrode are stacked, at least part of the control gate electrode being silicidated; and at least one dummy transistor formed on the semiconductor substrate, and including a first dummy electrode, and a second dummy electrode having a current leakage path and stacked on the first dummy electrode.

BRIEF DESCRIPTION OF THE SEVERAL VIEWS OF THE DRAWING

FIG. 2 is a process sectional view for explaining a method of manufacturing the EEPROM shown in FIG. 1;

FIG. 3 is a process sectional view for explaining the method of manufacturing the EEPROM shown in FIG. 1;

FIG. 4 is a process sectional view for explaining the method of manufacturing the EEPROM shown in FIG. 1;

FIG. 5 is a process sectional view for explaining the method of manufacturing the EEPROM shown in FIG. 1;

FIG. 6 is a process sectional view for explaining the method of manufacturing the EEPROM shown in FIG. 1;

FIG. 11 is a process sectional view for explaining the method of manufacturing the EEPROM shown in FIG. 1;

FIG. 12 is a process sectional view for explaining the method of manufacturing the EEPROM shown in FIG. 1;

FIG. 13 is a process sectional view for explaining the method of manufacturing the EEPROM shown in FIG. 1;

FIGS. 20A to 20C are diagrams for explaining the functions and effects of the EEPROM shown in FIG. 1;

FIG. 27 is a process sectional view for explaining the method of manufacturing the EEPROM shown in FIG. 21;

FIG. 28 is a process sectional view for explaining the method of manufacturing the EEPROM shown in FIG. 21;

FIG. 29 is a process sectional view for explaining the method of manufacturing the EEPROM shown in FIG. 21;

FIG. 30 is a process sectional view for explaining the method of manufacturing the EEPROM shown in FIG. 21;

FIG. 31 is a process sectional view for explaining the method of manufacturing the EEPROM shown in FIG. 21;

FIG. 32 is a process sectional view for explaining the method of manufacturing the EEPROM shown in FIG. 21;

FIG. 33 is a process sectional view for explaining the method of manufacturing the EEPROM shown in FIG. 21;

FIG. 37 is a process sectional view for explaining the method of manufacturing the EEPROM shown in FIG. 21;

FIG. 38 is a process sectional view for explaining the method of manufacturing the EEPROM shown in FIG. 21;

FIG. 39 is a process sectional view for explaining the method of manufacturing the EEPROM shown in FIG. 21;

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

Figure 1:
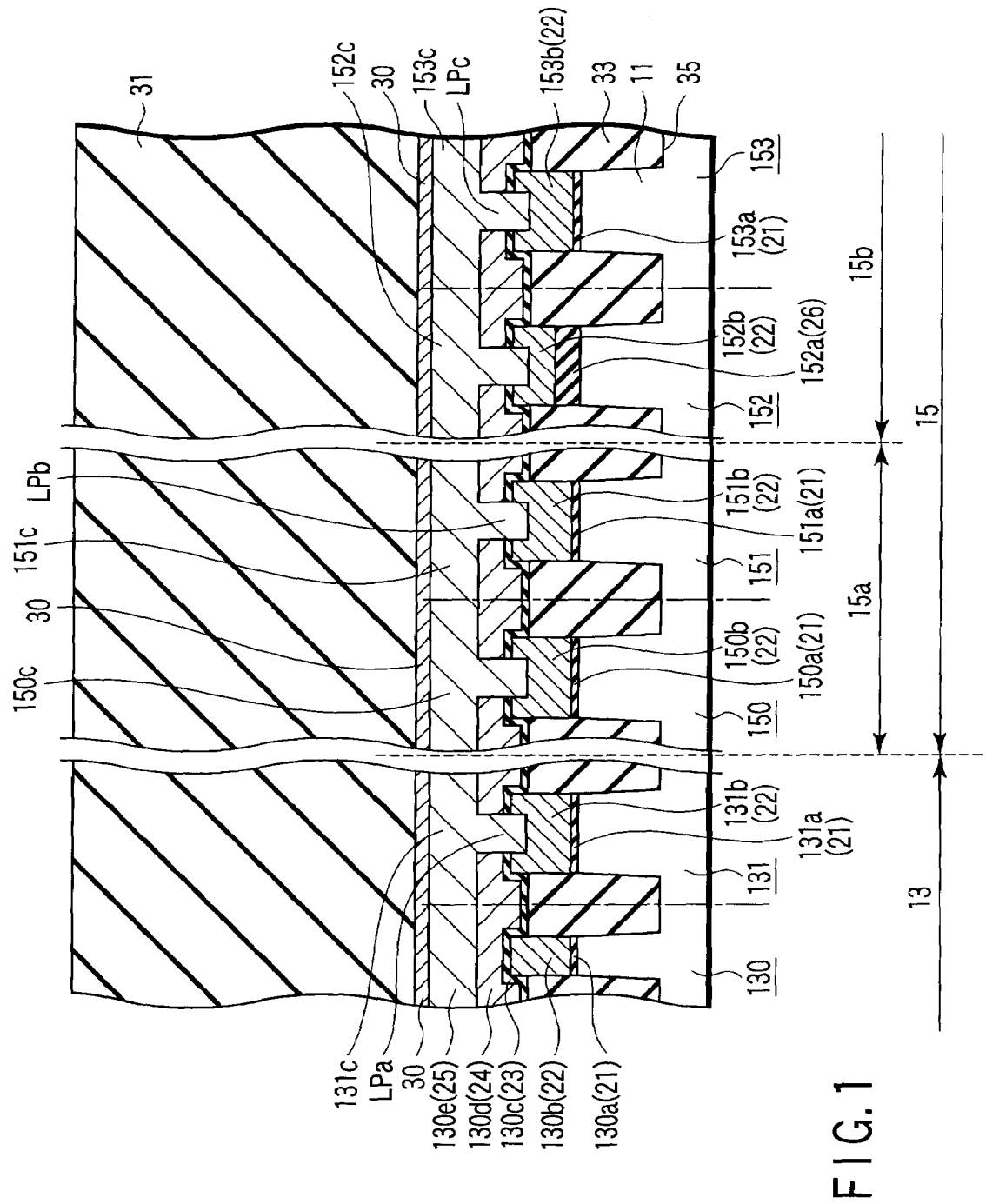
FIG. 1 is a sectional view showing an example of the configuration of a nonvolatile semiconductor storage device (EEPROM) according to a first embodiment of the present invention.

FIG. 1 shows the basic configuration of a nonvolatile semiconductor storage device according to a first embodiment of the present invention. It is to be noted that an EEPROM will be described as an example in the present embodiment which has conductive dummy electrodes that are not used for actual circuit operation, for example, a dummy memory cell (hereinafter, a dummy cell transistor) and a dummy peripheral circuit (hereinafter, a dummy peripheral transistor). Moreover, this is an example in which the dummy cell transistor and the dummy peripheral transistor have MISFET structures, and a gate insulating film of the high-voltage dummy peripheral transistor is reduced in thickness (e.g., formed to be smaller in thickness than a gate insulating film of an ordinary high-voltage transistor), thereby ensuring the conductivity of the high-voltage dummy peripheral transistor. Actually, the transistor is not a high-voltage transistor when the thickness of the gate insulating film is reduced to ensure conductivity, but in the following explanation, but it is called the high-voltage dummy peripheral transistor for convenience in order to distinguish it from a low-voltage dummy peripheral transistor.

This EEPROM has, for example, a configuration in which circuit units are formed by a plurality of transistor elements on the surface of a semiconductor substrate 11 made of silicon, as shown in FIG. 1. That is, a memory cell area 13 and a peripheral circuit area 15 are set in the surface of the semiconductor substrate 11. A low-voltage transistor area 15a and a high-voltage transistor area 15b are set in the peripheral circuit area 15.

In the memory cell area 13, there are formed a plurality of memory cells (cell transistors) (in the present example, one memory cell for convenience) 130, and several dummy cell transistors (at least one dummy cell transistor) 131. The memory cell 130 has a gate electrode unit with a two-layer (stacked) structure. Specifically, a floating gate electrode 130b formed of a first conductive film 22 is stacked on the surface of the semiconductor substrate 11 via a tunnel oxide film 130a formed of a first insulating film 21. Further, a first control gate electrode 130d formed of a second conductive film (e.g., a doped polysilicon film) 24, and a second control gate electrode 130e formed of a third conductive film (e.g., a doped polysilicon film) 25 are stacked in order on the floating gate electrode 130b via an interpoly insulating film 130c formed of a second insulating film 23. A silicide layer 30 is formed on the surface part of the second control gate electrode 130e.

On the other hand, the dummy cell transistor 131 is formed to have a current leakage path LPa. The current leakage path LPa has, for example, a structure in which part of a second dummy electrode 131c formed of the second conductive film 24 and the third conductive film 25 penetrates the second insulating film 23 and is connected to the first conductive film 22 serving as a first dummy electrode 131b. That is, this dummy cell transistor 131 is formed to have a single-layer gate electrode unit in which the first dummy electrode 131b formed of the first conductive film 22 is electrically connected to the second dummy electrode 131c formed of the second conductive film 24 and the third conductive film 25 via a gate oxide film 131a formed of the first insulating film 21 on the surface of the semiconductor substrate 11. In addition, the silicide layer 30 is formed on the surface part of the second dummy electrode 131c.

Conversely, a plurality of low-voltage transistors (peripheral transistors) (in the present example, one low-voltage transistor for convenience) 150, and several low-voltage dummy peripheral transistors (at least one low-voltage dummy peripheral transistor) 151 are formed in the low-voltage transistor area 15a of the peripheral circuit area 15. The low-voltage transistor 150 has a single-layer gate electrode unit in which a first gate electrode 150b formed of the first conductive film 22 is stacked on the surface of the semiconductor substrate 11 via a gate oxide film 150a formed of the first insulating film 21. Moreover, in this gate electrode unit, a current path for use in actual circuit operation is formed by a second gate electrode 150c formed of the second conductive film 24 and the third conductive film 25. That is, in the gate electrode unit, the third conductive film 25 forming the second gate electrode 150c penetrates the second conductive film 24 and the second insulating film 23 and is electrically connected to the first gate electrode 150b. In addition, the silicide layer 30 is formed on the surface part of the second gate electrode 150c.

On the other hand, the low-voltage dummy peripheral transistor 151 is formed to have a dummy gate electrode unit having the same structure as that of the gate electrode unit of the low-voltage transistor 150. That is, this low-voltage dummy peripheral transistor 151 has, for example, a single-layer dummy electrode unit in which a first dummy electrode 151b formed of the first conductive film 22 is stacked on the surface of the semiconductor substrate 11 via a gate oxide film 151a formed of the first insulating film 21. Moreover, this dummy electrode unit is formed to have a current leakage path LPb having a structure in which the third conductive film 25 forming a second dummy electrode 151c penetrates the second conductive film 24 and the second insulating film 23 and is electrically connected to the first dummy electrode 151b. In addition, the silicide layer 30 is formed on the surface part of the second dummy electrode 151c.

In the high-voltage transistor area 15b, there are formed a plurality of high-voltage transistors (peripheral transistors) (in the present example, one high-voltage transistor for convenience) 152, and several high-voltage dummy peripheral transistors (at least one high-voltage dummy peripheral transistor) 153. The high-voltage transistor 152 has a single-layer gate electrode unit in which a first gate electrode 152b formed of the first conductive film 22 is stacked on the surface of the semiconductor substrate 11 via a gate oxide film 152a formed of a third insulating film 26 whose thickness is larger than the thickness of the first insulating film 21. Moreover, in this gate electrode unit, a current path for use in actual circuit operation is formed by a second gate electrode 152c formed of the second conductive film 24 and the third conductive film 25. That is, in the gate electrode unit, the third conductive film 25 forming the second gate electrode 152c penetrates the second conductive film 24 and the second insulating film 23 and is electrically connected to the first gate electrode 152b. In addition, the silicide layer 30 is formed on the surface part of the second gate electrode 152c.

On the other hand, the high-voltage dummy peripheral transistor 153 is formed to have a dummy gate electrode unit having the same structure as that of the gate electrode unit of the low-voltage transistor 150 and that of the dummy gate electrode unit of the low-voltage dummy peripheral transistor 151. That is, this high-voltage dummy peripheral transistor 153 has, for example, a single-layer dummy electrode unit in which a first dummy electrode 153b formed of the first conductive film 22 is stacked on the surface of the semiconductor substrate 11 via a gate oxide film 153a formed of the first insulating film 21 whose thickness is larger than the thickness of the gate oxide film 152a formed of the third insulating film 26. Moreover, this dummy electrode unit is formed to have a current leakage path LPc having a structure in which the third conductive film 25 forming a second dummy electrode 153c penetrates the second conductive film 24 and the second insulating film 23 and is electrically connected to the first dummy electrode 153b. In addition, the silicide layer 30 is formed on the surface part of the second dummy electrode 153c.

In the present embodiment, the silicide layer 30 for decreasing resistance is formed on the upper surface of the third conductive film 25. Further, a thick interlayer insulating film 31 is provided on the semiconductor substrate 11 including the upper part of the third conductive film 25 via the silicide layer 30.

Furthermore, element separation areas 35 formed by embedding element separation insulating film 33 in the surface part of the semiconductor substrate 11 are defined between the memory cell area 13 and the low-voltage transistor area 15a of the peripheral circuit area 15 and between the low-voltage transistor area 15a and the high-voltage transistor area 15b. In the same manner, the element separation areas 35 are defined between the memory cell 130 and the dummy cell transistor 131 in the memory cell area 13, between the low-voltage transistor 150 and the dummy peripheral transistor 151 in the low-voltage transistor area 15a, and between the high-voltage transistor 152 and the dummy peripheral transistor 153 in the high-voltage transistor area 15b.

In the case of the EEPROM having the configuration described above, the dummy cell transistor 131 of the MISFET structure having the current leakage path LPa is disposed in the peripheral part of the memory cell 130 in the memory cell area 13. Further, in the low-voltage transistor area 15a of the peripheral circuit area 15, the dummy peripheral transistor 151 of the MISFET structure having the current leakage path LPb is disposed in the peripheral part of the low-voltage transistor 150. Moreover, in the high-voltage transistor area 15b of the peripheral circuit area 15, the dummy peripheral transistor 153 of the MISFET structure having the current leakage path LPc is disposed in the peripheral part of the high-voltage transistor 152. The provision of the dummy cell transistor 131 and the dummy peripheral transistors 151 and 153 makes it easy to maintain a constant planarity at the time of processing, for example, a high-quality finish by the chemical mechanical polishing (CMP) method within the surface of a wafer.

In addition, in an actual EEPROM, a plurality of memory cells 130 having the configuration described above are arranged in matrix (lattice) form to form a cell array having a predetermined memory capacity, and a desired logic circuit (peripheral circuit) is formed by the low- and high-voltage peripheral transistors 150 and 152.

Next, a method of manufacturing the EEPROM having the configuration described above will be briefly explained. It is to be noted that in the present example, processes which are not directly concerned with the configuration of the present embodiment are not described, such as an ion implantation process and a thermal process out of processes for forming the memory cell and the peripheral transistor.

First, the third insulating film 26 for forming the gate oxide film 152a of the high-voltage transistor 152 is formed on the entire surface of the semiconductor substrate 11 (see FIG. 2). Then, areas other than an area for forming the high-voltage transistor 152 of the high-voltage transistor area 15b are opened by a lithographic process. That is, the area for forming the high-voltage transistor 152 alone is patterned with a resist 41 (see FIG. 3). Then, this resist 41 is used as a mask to remove the third insulating film 26 in other areas. Thus, after the third insulating film 26 is left in the area for forming the high-voltage transistor 152 alone, the resist 41 is removed (see FIG. 4). As described above, the area for forming the high-voltage dummy peripheral transistor 153 in the high-voltage transistor area 15b is also opened once in contrast with conventional cases.

Next, the first insulating film 21 is formed on the entire surface of the substrate 11 to form the tunnel oxide film 130a of the memory cell 130, the gate oxide film 131a of the dummy cell transistor 131, the gate oxide film 150a of the low-voltage transistor 150, the gate oxide film 151a of the low-voltage dummy peripheral transistor 151, and the gate oxide film 153a of the high-voltage dummy peripheral transistor 153 (see FIG. 5). The first insulating film 21 is formed to be thinner than the third insulating film 26 formed in the previous process. This makes it possible to control the gate oxide film 153a of the high-voltage dummy peripheral transistor 153 formed in the high-voltage transistor area 15b so that the thickness of this gate oxide film 153a may be the same as the thickness of the gate oxide film 150a of the low-voltage transistor 150, the thickness of the tunnel oxide film 130a of the memory cell 130, etc.

Next, the first conductive film 22 made of polysilicon doped with impurities is formed on the entire surface of the substrate 11 via the first and third insulating films 21 and 26 so that the first conductive film 22 serves as the floating gate electrode 130b of the memory cell 130, the first dummy electrode 131b of the dummy cell transistor 131, the first gate electrode 150b of the low-voltage transistor 150, the first dummy electrode 151b of the low-voltage dummy peripheral transistor 151, the first gate electrode 152b of the high-voltage transistor 152, and the first dummy electrode 153b of the high-voltage dummy peripheral transistor 153 (see FIG. 6).

Figure 7:
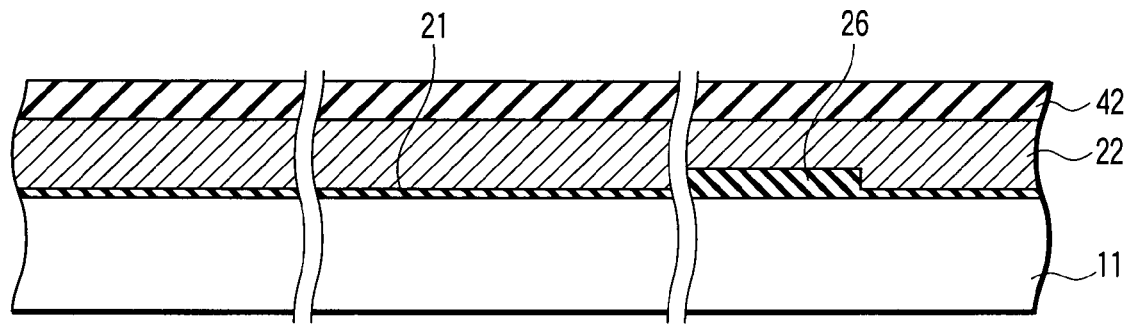
FIG. 7 is a process sectional view for explaining the method of manufacturing the EEPROM shown in FIG. 1.

On the top of the first conductive film 22, a silicon nitride (SiN) film 42 serving as a hard mask for processing is formed (see FIG. 7).

Figure 8:
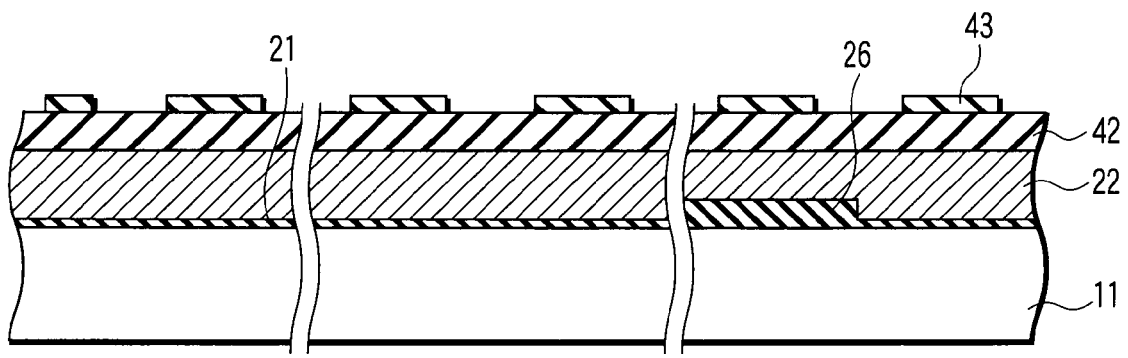
FIG. 8 is a process sectional view for explaining the method of manufacturing the EEPROM shown in FIG. 1.
Figure 9:
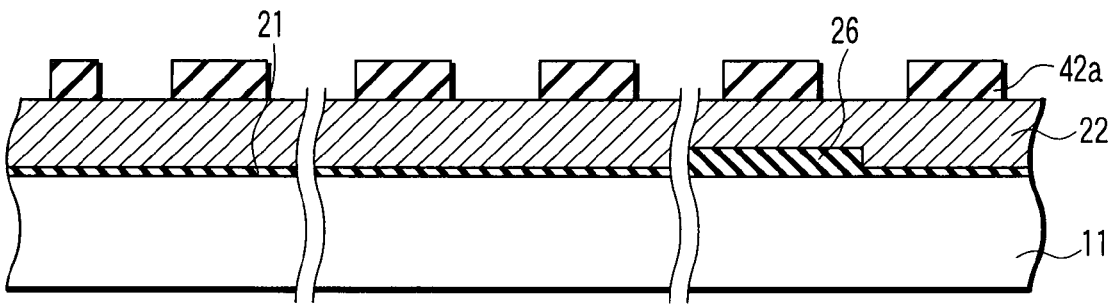
FIG. 9 is a process sectional view for explaining the method of manufacturing the EEPROM shown in FIG. 1.

Next, the top of the SiN film 42 is patterned with a resist 43 for forming the element separation areas 35 by a lithographic process (see FIG. 8). Then, the SiN film 42 is selectively etched and removed using this resist 43 as a mask to form a hard mask 42a, and the resist 43 is then removed (see FIG. 9).

Figure 10:
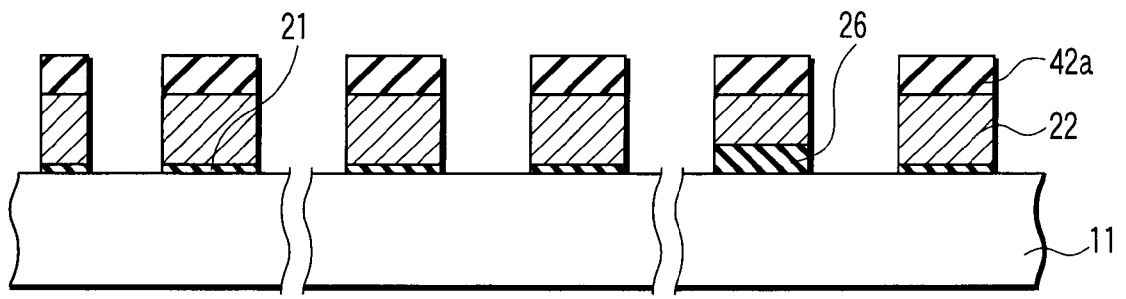
FIG. 10 is a process sectional view for explaining the method of manufacturing the EEPROM shown in FIG. 1.
Figure 14:
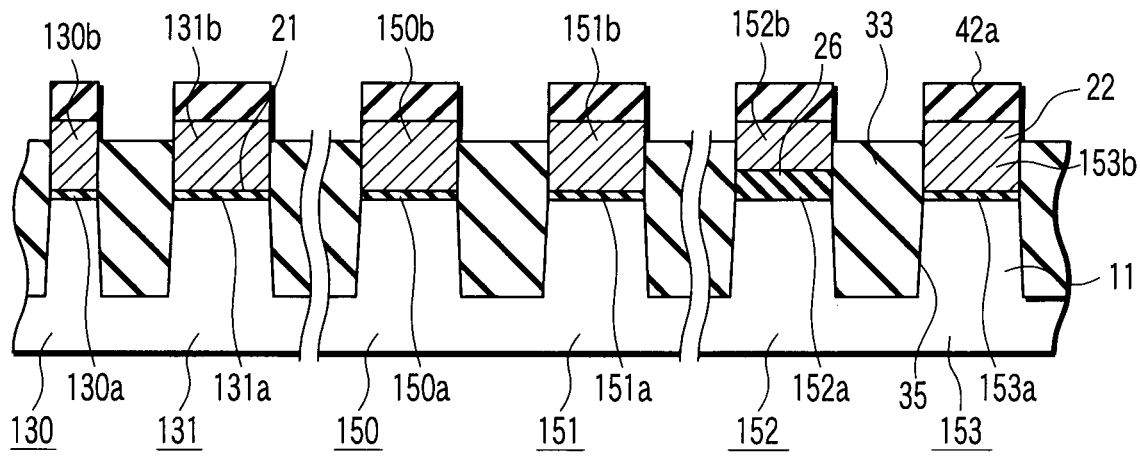
FIG. 14 is a process sectional view for explaining the method of manufacturing the EEPROM shown in FIG. 1.

Next, the first conductive film 22 and the first and third insulating films 21 and 26 are etched using the hard mask 42a (see FIG. 10), and the surface part of the substrate 11 is etched at a proper depth to form a groove 35a (see FIG. 11). Then, the element separation insulating film 33 is deposited on the entire surface of the substrate 11 to fill the groove 35a (see FIG. 12), and the surface of the element separation insulating film 33 is polished by, for example, a CMP method and planarized so that the element separation insulating film 33 is as high as the upper end of the hard mask 42a (see FIG. 13). Further, the element separation insulating film 33 is etched until the top of the first conductive film 22 projects (see FIG. 14), and then the hard mask 42a is removed.

In this manner, element areas are defined by the element separation areas 35 embedded with the element separation insulating film 33. Thus, the tunnel oxide film 130a and the floating gate electrode 130b of the memory cell 130, and the gate oxide film 131a and the first dummy electrode 131b of the dummy cell transistor 131 are formed in the element areas corresponding to the memory cell area 13. Further, the gate oxide film 150a and the first gate electrode 150b of the low-voltage transistor 150, and the gate oxide film 151a and the first dummy electrode 151b of the low-voltage dummy peripheral transistor 151 are formed in the element areas corresponding to the low-voltage transistor area 15a of the peripheral circuit area 15. Still further, the gate oxide film 152a and the first gate electrode 152b of the high-voltage transistor 152, and the gate oxide film 153a and the first dummy electrode 153b of the high-voltage dummy peripheral transistor 153 are formed in the element areas corresponding to the high-voltage transistor area 15b of the peripheral circuit area 15.

Figure 15:
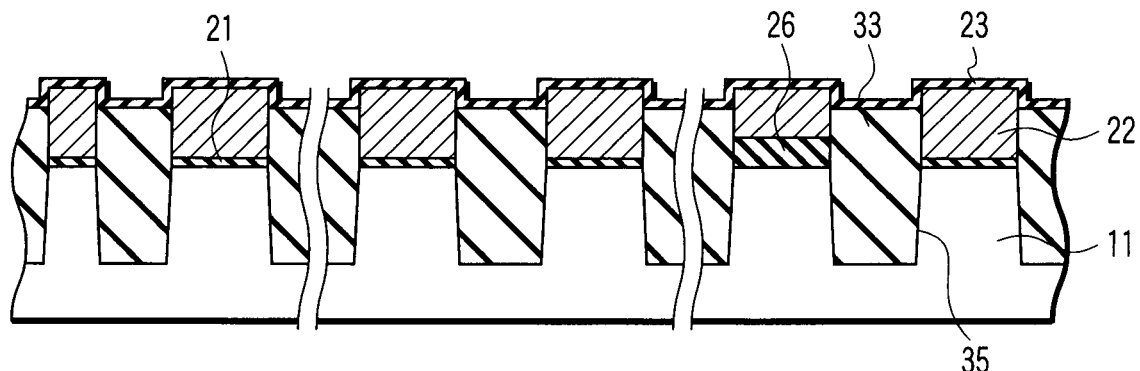
FIG. 15 is a process sectional view for explaining the method of manufacturing the EEPROM shown in FIG. 1.
Figure 16:
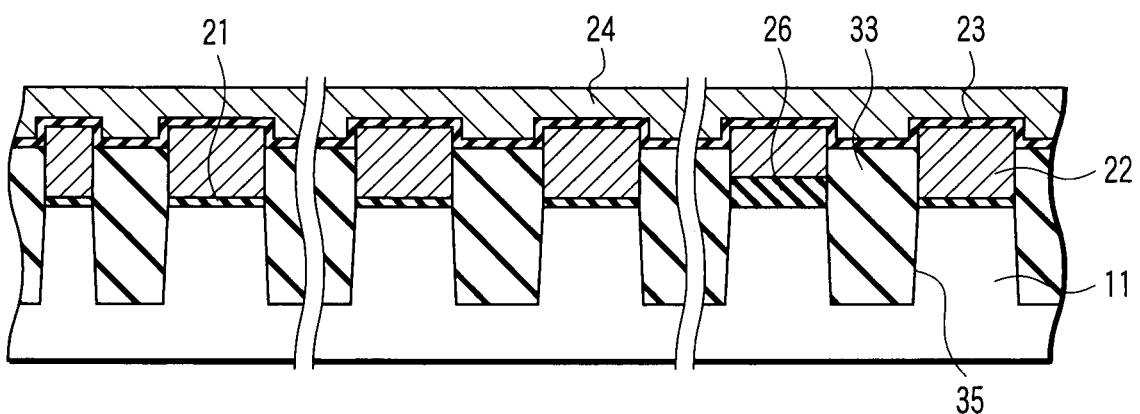
FIG. 16 is a process sectional view for explaining the method of manufacturing the EEPROM shown in FIG. 1.

Next, the second insulating film 23 for forming the inter-poly insulating film 130c, etc., is formed on the entire surface of the substrate 11 (see FIG. 15), and then the second conductive film 24 made of polysilicon doped with impurities is formed (see FIG. 16).

Figure 17:
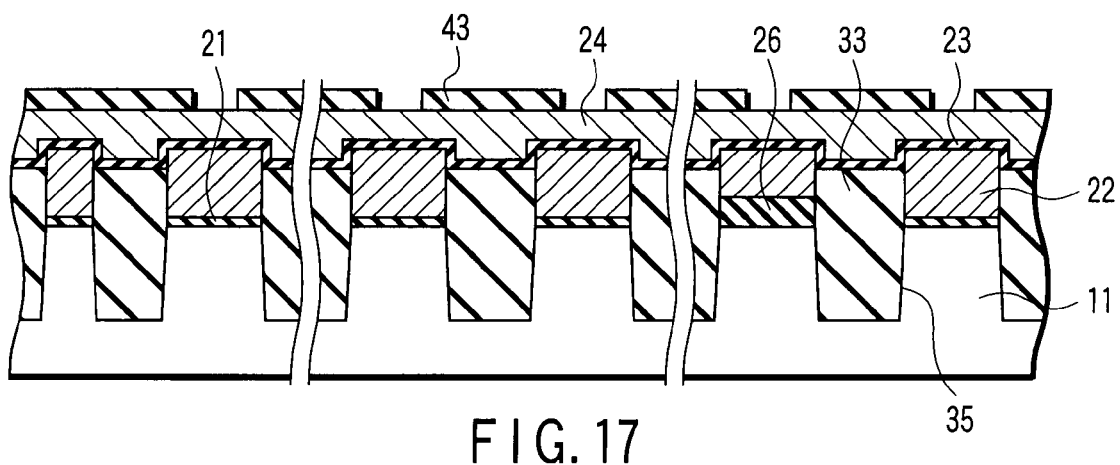
FIG. 17 is a process sectional view for explaining the method of manufacturing the EEPROM shown in FIG. 1.
Figure 18:
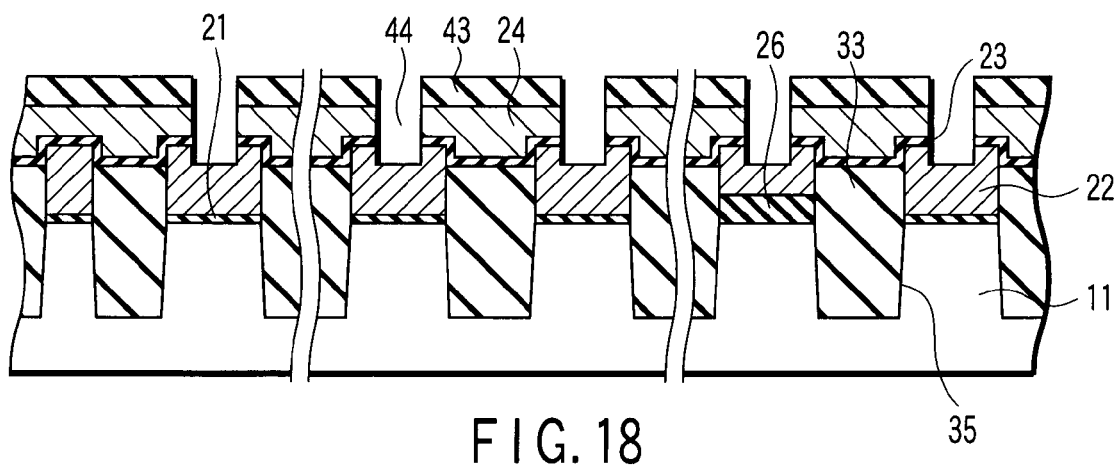
FIG. 18 is a process sectional view for explaining the method of manufacturing the EEPROM shown in FIG. 1.

Next, the second insulating film 23 is opened. The opening of the second insulating film 23 is targeted at all the transistor elements except for the memory cell 130 in the memory cell area 13 and the peripheral circuit area 15 regardless of whether these transistor elements have transistor functions, in contrast with conventional cases. That is, the opening is targeted not only for the low-voltage transistor 150 and the high-voltage transistor 152 but also for the dummy cell transistor 131, the low-voltage dummy peripheral transistor 151 and the high-voltage dummy peripheral transistor 153. In other words, the top of the second conductive film 24 is patterned with the resist 43 by a lithographic process to cover areas other than areas for forming the dummy cell transistor 131, the low-voltage transistor 150, the low-voltage dummy peripheral transistor 151, the high-voltage transistor 152 and the high-voltage dummy peripheral transistor 153 (see FIG. 17). Then, the resist 43 is used as a mask to selectively etch parts of the second conductive film 24, the second insulating film 23 and the first conductive film 22, thereby forming an opening 44 (see FIG. 18).

Figure 19:
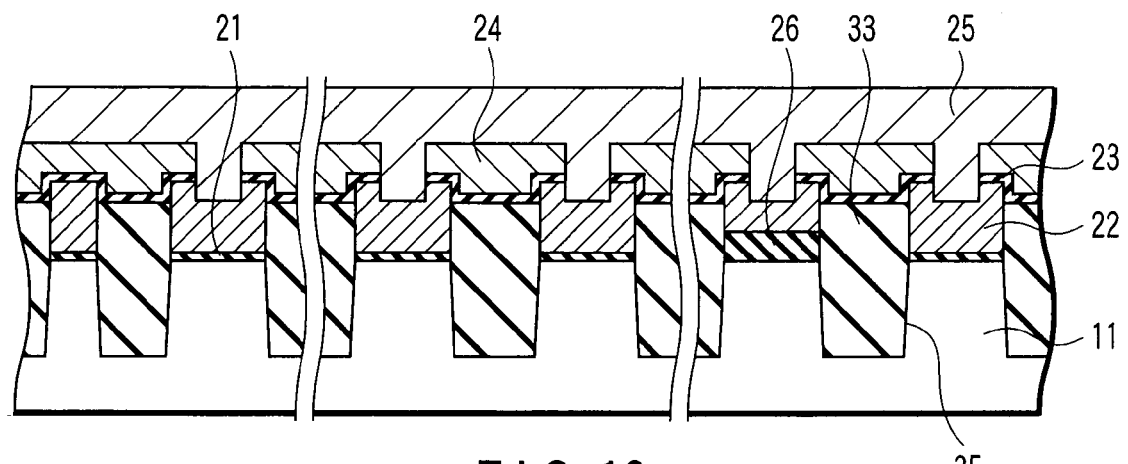
FIG. 19 is a process sectional view for explaining the method of manufacturing the EEPROM shown in FIG. 1.

Next, after the resist 43 is removed, the third conductive film 25 made of polysilicon doped with impurities is formed on the entire surface of the substrate 11 (see FIG. 19). Then, the third conductive film 25 is patterned so that the third conductive film 25 is electrically connected to the first conductive film 22 formed of the second conductive film 24, not only for the low-voltage transistor 150 and the high-voltage transistor 152 but also for the dummy cell transistor 131, the low-voltage dummy peripheral transistor 151 and the high-voltage dummy peripheral transistor 153 (electrically, a MISFET structure is formed).

That is, in the memory cell area 13 on the surface of the semiconductor substrate 11, the memory cell 130 having the two-layer structure gate electrode unit is formed wherein the floating gate electrode 130b formed of the first conductive film 22 is stacked via the tunnel oxide film 130a formed of the first insulating film 21, on which the first control gate electrode 130d formed of the second conductive film 24 and the second control gate electrode 130e formed of the third conductive film are stacked in order via the interpoly insulating film 130c formed of the second insulating film 23. The dummy cell transistor 131 having the single-layer gate electrode unit is also formed in the memory cell area 13 wherein the first dummy electrode 131b formed of the first conductive film 22 is electrically connected to the second dummy electrode 131c formed of the second conductive film 24 and the third conductive film 25 via the gate oxide film 131a formed of the first insulating film 21.

Conversely, in the low-voltage transistor area 15a of the peripheral circuit area 15 on the surface of the semiconductor substrate 11, the low-voltage transistor 150 having the single-layer gate electrode unit is formed wherein the first gate electrode 150b formed of the first conductive film 22 is electrically connected to the second gate electrode 150c formed of the second conductive film 24 and the third conductive film 25 via the gate oxide film 150a formed of the first insulating film 21. The low-voltage dummy peripheral transistor 151 having the single-layer gate electrode unit is also formed in the low-voltage transistor area 15a wherein the first dummy electrode 151b formed of the first conductive film 22 is electrically connected to the second dummy electrode 151c formed of the second conductive film 24 and the third conductive film 25 via the gate oxide film 151a formed of the first insulating film 21.

On the other hand, in the high-voltage transistor area 15b of the peripheral circuit area 15 on the surface of the semiconductor substrate 11, the high-voltage transistor 152 having the single-layer gate electrode unit is formed wherein the first gate electrode 152b formed of the first conductive film 22 is electrically connected to the second gate electrode 152c formed of the second conductive film 24 and the third conductive film 25 via the gate oxide film 152a formed of the third insulating film 26 whose thickness is larger than the thickness of the first insulating film 21. The high-voltage dummy peripheral transistor 153 having the single-layer gate electrode unit is also formed in the high-voltage transistor area 15b wherein the first dummy electrode 153b formed of the first conductive film 22 is electrically connected to the second dummy electrode 153c formed of the second conductive film 24 and the third conductive film 25 via the gate oxide film 153a formed of the first insulating film 21 whose thickness is smaller than the thickness of the third insulating film 26.

Next, the silicon nitride film (not shown) for patterning remaining on the surface of the third conductive film 25 is removed by dry etching, and then polysilicon is caused to react with a metal to form the silicide layer 30 on the surface of the third conductive film 25. During this etching, most of the charge which has entered exposed polysilicon subjected to plasma escapes to the semiconductor substrate 11 via the current leakage path LPa of the dummy cell transistor 131 and the current leakage paths LPb and LPc of the low- and high-voltage dummy peripheral transistors 151 and 153 without being trapped in the interpoly insulating film 130c of the memory cell 130 and in the gate oxide films 150a and 152a of the low- and high-voltage transistors 150 and 152. It is therefore possible to reduce a plasma damage (charge-up attributed to the dry etching) in which the threshold values of the memory cell 130 and the low- and high-voltage transistors 150 and 152 vary due to a variation of a threshold value corresponding to the charge trapped during the dry etching leading to a decrease in the reliability of the EEPROM.

Thereafter, the interlayer insulating film 31 is formed on the entire surface of the substrate 11 including the top of the silicide layer 30. Then, the surface of the interlayer insulating film 31 is planarized by the CMP method, such that the EEPROM having the structure shown in FIG. 1 can be obtained.

As described above, the dummy cell transistor 131 and the low- and high-voltage dummy peripheral transistors 151 and 153 have the MISFET structures, and the current leakage paths LPa, LPb and LPc are formed. Moreover, the thickness of the gate oxide film 153a of the high-voltage dummy peripheral transistor 153 is formed to be smaller than the thickness of the gate oxide film 152a of the high-voltage transistor 152. This allows a current to run to the dummy cell transistor 131 and the low- and high-voltage dummy peripheral transistors 151 and 153, such that voltages applied to the interpoly insulating film 130c of the memory cell 130 and to the gate oxide films 150a and 152a of the low- and high-voltage transistors 150 and 152 can be decreased during the dry etching. As a result, it is possible to reduce the charge trapped in the interpoly insulating film 130c of the memory cell 130 and in the gate oxide films 150a and 152a of the low- and high-voltage transistors 150 and 152. Therefore, even when silicide is used for the control gate electrode of the memory cell 130, it is possible to reduce the variations of the threshold values of the memory cell 130 and the low- and high-voltage transistors 150 and 152 corresponding to the trapped charge and to improve the reliability of the memory cell 130 and the low- and high-voltage transistors 150 and 152.

Here, functions and effects of reducing the charge-up attributed to the dry etching are considered in the case of the configuration described above. In the EEPROM, there are generally disposed a large number of dummy transistor elements (simply, dummy elements) called dummy cell transistors and dummy peripheral transistors that are not used for actual circuit operation, as described above. The dummy elements serve to maintain a constant finished height within the surface of the wafer at the time of the processing by the CMP method. In the meantime, the dummy elements are electrically insulated from other circuits and electrically serve for nothing. That is, the difference between the dummy elements, and the memory cell and the peripheral transistor is that the dummy elements are electrically insulated from other circuits.

Conventionally, the forming method and film structure of the dummy elements are not basically different from those of the memory cell expect that the high-voltage transistor in the high-voltage transistor area and the gate insulating films of the dummy peripheral transistors are thicker than the tunnel oxide film of the memory cell. Therefore, in the dummy element, the second dummy electrode corresponding to the control gate electrode is electrically insulated from the first dummy electrode corresponding to the floating gate electrode, and the first dummy electrode corresponding to the floating gate electrode is electrically insulated from the substrate.

Thus, the original meaning of the dummy element is in its shape, so that the thickness of the gate insulating film is not intentionally adjusted. Therefore, in the case of a conventional EEPROM, the gate insulating film of the high-voltage dummy peripheral transistor is the same in thickness as the gate insulating film of the high-voltage transistor, and the gate insulating films of the low-voltage dummy peripheral transistor and the dummy cell transistor are the same in thickness as the gate insulating films of the low-voltage transistor and the memory cell.

Effects will be described below in connection with the case where the thickness of the gate insulating film of the high-voltage dummy peripheral transistor is smaller than the thickness of the gate insulating film of the high-voltage transistor as in the EEPROM shown in the first embodiment described above.

FIG. 20A schematically shows how plasma and a substrate are during the dry etching. A substrate 2 is placed in a plasma atmosphere 1, and memory cells 3, a peripheral transistor 4 and a dummy element 5 are on the substrate 2. A voltage is applied to the substrate 2, and a potential difference V is present between plasma and the substrate 2.

First, a charge accumulated in the peripheral transistor 4 in the conventional EEPROM is considered. FIG. 20B shows an equivalent circuit of the conventional EEPROM. In this example, attention is focused on the peripheral transistor 4 and the dummy element 5 without considering the memory cells 3 for clarity.

The capacitance of the peripheral transistor 4 is $C_P$, the capacitance of the dummy element 5 is $C_D$, a charge accumulated in the peripheral transistor 4 is $Q_P$, a charge accumulated in the dummy element 5 is $Q_D$, and the resistance of the substrate 2 is $R_S$. The peripheral transistor 4 and the dummy element 5 are electrically connected to each other on the substrate 2 and also connected to each other by plasma.

Therefore, the charge $Q_P$ accumulated in the peripheral transistor 4 is $$Q_P = C_P \cdot V \qquad (1).$$

Next, the charge accumulated in the peripheral transistor 4 in the EEPROM having the configuration shown in the first embodiment is considered. FIG. 20C shows an equivalent circuit of the EEPROM having the configuration shown in the first embodiment. As in the conventional case, attention is focused on the peripheral transistor 4 and the dummy element 5 without considering the memory cells 3 for clarity.

In the case of the configuration in the first embodiment, a current runs to the dummy element 5, so that the dummy element 5 can be regarded as a resistance (dummy resistance) $R_D$. Further, a voltage applied to this dummy element 5 is $V_D$, and a voltage similarly applied to a resistance (substrate resistance $R_S$) of the substrate 2 is $V_S$.

Then, a charge $Q_P'$ accumulated in the peripheral transistor 4 is $$Q_P' = C_P \cdot V_D \qquad (2).$$

Since the potential difference V is $$V = V_D + V_S \qquad (3),$$

the substitution of this Equation (3) for Equation (2) leads to $$Q_P' = C_P(V - V_S) \qquad (4),$$

so that the charge $Q_P'$ accumulated in the peripheral transistor 4 is smaller than that in the conventional EEPROM.

Furthermore, since the voltage $V_D$ is $$V_D = R_D \cdot V/(R_S + R_D) = V/(R_S/R_D + 1) \qquad (5),$$

the charge $Q_P'$ is $$Q_P' = C_P \cdot V/(R_S/R_D + 1) \qquad (6),$$

which shows that the charge $Q_P'$ is in inverse proportion to the ratio ($R_S/R_D$) between the substrate resistance and dummy resistance. That is, when the resistance $R_D$ of the dummy element 5 is smaller, the charge $Q_P'$ accumulated in the peripheral transistor 4 is smaller.

Thus, when the EEPROM has the configuration of the first embodiment, that is, when silicide is used for the control gate electrode of the memory cell 130 in the EEPROM, the dummy peripheral transistor 153 of the high-voltage transistor area 15b has a configuration in which the first dummy electrode 153b is electrically connected to the second dummy electrode 153c and which comprises the gate oxide film 153a having about the same thickness as that of the gate oxide films 150a of the low-voltage transistor 150, such that the plasma damage to the memory cell 130 and the low- and high-voltage transistors 150 and 152 during the dry etching can be reduced, and the variation of the threshold value due to the plasma damage can be suppressed.

In addition, although not described in detail, the same applies to the memory cell 3. That is, the charge accumulated in the memory cell 3 can be reduced by lowering the resistance $R_D$ Of the dummy element 5.

In the configuration of the first embodiment described above, the gate oxide film 153a of the high-voltage dummy peripheral transistor 153 can be the same in thickness as the tunnel oxide film 130a of the memory cell 130, the gate oxide film 131a of the dummy cell transistor 131, the gate oxide film 150a of the low-voltage transistor 150, and the gate oxide film 151a of the low-voltage dummy peripheral transistor 151, without much increase in the number of processes.

Furthermore, the first embodiment described above is not limited to the case where the gate oxide film 153a of the high-voltage dummy peripheral transistor 153 is the same in thickness as the tunnel oxide film 130a of the memory cell 130, the gate oxide film 131a of the dummy cell transistor 131, the gate oxide film 150a of the low-voltage transistor 150, and the gate oxide film 151a of the low-voltage dummy peripheral transistor 151. For example, the thickness of the gate oxide film 153a of the high-voltage dummy peripheral transistor 153 can be smaller.

Second Embodiment

Figure 21:
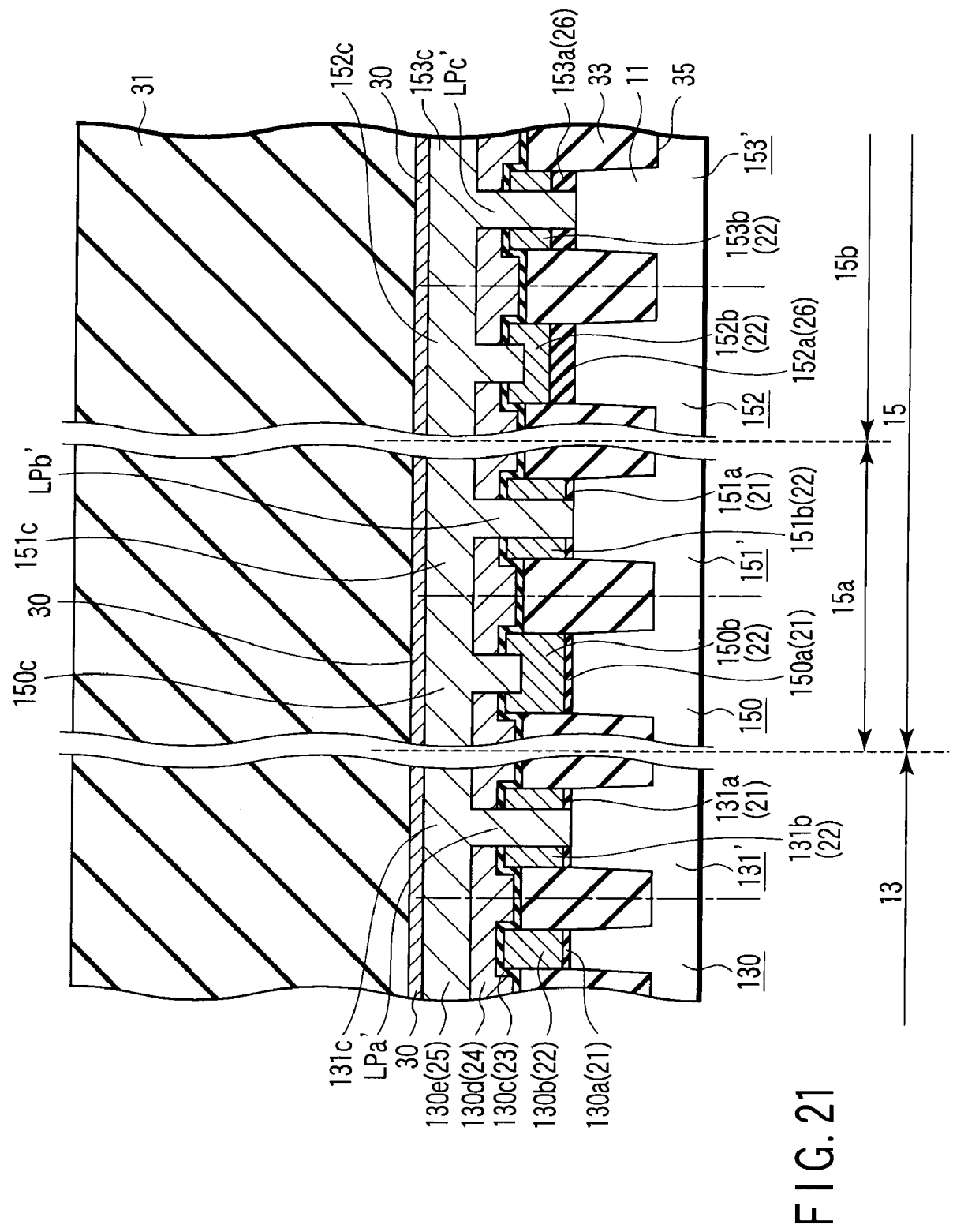
FIG. 21 is a sectional view showing an example of the configuration of a nonvolatile semiconductor storage device (EEPROM) according to a second embodiment of the present invention.

FIG. 21 shows the basic configuration of a nonvolatile semiconductor storage device according to a second embodiment of the present invention. In the present embodiment, an example of an EEPROM will be described which has, for example, a dummy memory cell (hereinafter, a dummy cell transistor) and a dummy peripheral circuit (hereinafter, a dummy peripheral transistor) including conductive dummy electrodes that are not used for actual circuit operation. Further, this is an example in which gate insulating films of the dummy cell transistor and the dummy peripheral transistor are opened to reduce dummy resistance such that the conductivity of a high-voltage dummy peripheral transistor is increased. It is to be noted that the same signs are assigned to the same parts as those in the EEPROM having the configuration shown in the first embodiment, and these parts are not described in detail.

This EEPROM has a configuration in which circuit units are formed by a plurality of transistor elements on the surface of a semiconductor substrate 11 made of silicon, for example, as shown in FIG. 21. That is, a memory cell area 13 and a peripheral circuit area 15 are set in the surface of the semiconductor substrate 11. A low-voltage transistor area 15a and a high-voltage transistor area 15b are further set in the peripheral circuit area 15.

In the memory cell area 13, there are formed a plurality of memory cells (cell transistors) (in the present example, one memory cell for convenience) 130, and several dummy cell transistors (at least one dummy cell transistor) 131'. The memory cell 130 has a gate electrode unit with a two-layer (stacked) structure. Specifically, a floating gate electrode 130b formed of a first conductive film 22 is stacked on the surface of the semiconductor substrate 11 via a tunnel oxide film 130a formed of a first insulating film 21. Further, a first control gate electrode 130d formed of a second conductive film (e.g., a doped polysilicon film) 24, and a second control gate electrode 130e formed of a third conductive film (e.g., a doped polysilicon film) 25 are stacked in order on the floating gate electrode 130b via an interpoly insulating film 130c formed of a second insulating film 23. A silicide layer 30 is formed on the surface part of the second control gate electrode 130e.

On the other hand, the dummy cell transistor 131' is formed to have a current leakage path LPa'. The current leakage path LPa' has, for example, a structure in which the third conductive film 25 forming a second dummy electrode 131c penetrates the second conductive film 24, the second insulating film 23, a first dummy electrode 131b formed of the first conductive film 22, and a gate oxide film 131a formed of the first insulating film 21, and is electrically connected to the substrate 11. That is, this dummy cell transistor 131' is formed to have a gate electrode unit in which the first dummy electrode 131b formed of the first conductive film 22 and the second dummy electrode 131c formed of the second conductive film 24 and the third conductive film 25 are directly connected to the semiconductor substrate 11. In addition, the silicide layer 30 is formed on the surface part of the second dummy electrode 131c.

Conversely, a plurality of low-voltage transistors (peripheral transistors) (in the present example, one low-voltage transistor for convenience) 150, and several low-voltage dummy peripheral transistors (at least one low-voltage dummy peripheral transistor) 151' are formed in the low-voltage transistor area 15a of the peripheral circuit area 15. The low-voltage transistor 150 has a single-layer gate electrode unit in which a first gate electrode 150b formed of the first conductive film 22 is stacked on the surface of the semiconductor substrate 11 via a gate oxide film 150a formed of the first insulating film 21. Moreover, in this gate electrode unit, a current path for use in actual circuit operation is formed by a second gate electrode 150c formed of the second conductive film 24 and the third conductive film 25. That is, in the gate electrode unit, the third conductive film 25 forming the second gate electrode 150c penetrates the second conductive film 24 and the second insulating film 23 and is electrically connected to the first gate electrode 150b. In addition, the silicide layer 30 is formed on the surface part of the second gate electrode 150c.

On the other hand, the low-voltage dummy peripheral transistor 151' is formed to have a current leakage path LPb' having a structure in which the third conductive film 25 forming a second dummy electrode 151c penetrates the second conductive film 24, the second insulating film 23, a first dummy electrode 151b formed of the first conductive film 22, and a gate oxide film 151a formed of the first insulating film 21, and is directly connected to the semiconductor substrate 11. In addition, the silicide layer 30 is formed on the surface part of the second dummy electrode 151c.

In the high-voltage transistor area 15b, there are formed a plurality of high-voltage transistors (peripheral transistors) (in the present example, one high-voltage transistor for convenience) 152, and several high-voltage dummy peripheral transistors (at least one high-voltage dummy peripheral transistor) 153'. The high-voltage transistor 152 has a single-layer gate electrode unit in which a first gate electrode 152b formed of the first conductive film 22 is stacked on the surface of the semiconductor substrate 11 via a gate oxide film 152a formed of a third insulating film 26 whose thickness is larger than the thickness of the first insulating film 21. Moreover, in this gate electrode unit, a current path for use in actual circuit operation is formed by a second gate electrode 152c formed of the second conductive film 24 and the third conductive film 25. That is, in the gate electrode unit, the third conductive film 25 forming the second gate electrode 152c penetrates the second conductive film 24 and the second insulating film 23 and is electrically connected to the first gate electrode 152b. In addition, the silicide layer 30 is formed on the surface part of the second gate electrode 152c.

On the other hand, the high-voltage dummy peripheral transistor 153' is formed to have a current leakage path LPc' having a structure in which the third conductive film 25 forming a second dummy electrode 153c penetrates the second conductive film 24, the second insulating film 23, a first dummy electrode 153b formed of the first conductive film 22, and a gate oxide film 153a formed of the third insulating film 26, and is directly connected to the semiconductor substrate 11. In addition, the silicide layer 30 is formed on the surface part of the second dummy electrode 153c.

In the present embodiment, the silicide layer 30 for decreasing resistance is formed on the upper surface of the third conductive film 25. Further, a thick interlayer insulating film 31 is provided on the semiconductor substrate 11 including the upper part of the third conductive film 25 via the silicide layer 30.

Furthermore, element separation areas 35 formed by embedding element separation insulating film 33 in the surface part of the semiconductor substrate 11 are defined between the memory cell area 13 and the low-voltage transistor area 15a of the peripheral circuit area 15 and between the low-voltage transistor area 15a and the high-voltage transistor area 15b. In the same manner, the element separation areas 35 are defined between the memory cell 130 and the dummy cell transistor 131' in the memory cell area 13, between the low-voltage transistor 150 and the dummy peripheral transistor 151' in the low-voltage transistor area 15a, and between the high-voltage transistor 152 and the dummy peripheral transistor 153' in the high-voltage transistor area 15b.

In the case of the EEPROM having the configuration described above, the dummy cell transistor 131' having the current leakage path LPa' is disposed in the peripheral part of the memory cell 130 in the memory cell area 13. Further, in the low-voltage transistor area 15a of the peripheral circuit area 15, the dummy peripheral transistor 151' having the current leakage path LPb' is disposed in the peripheral part of the low-voltage transistor 150. Moreover, in the high-voltage transistor area 15b of the peripheral circuit area 15, the dummy peripheral transistor 153' having the current leakage path LPc is disposed in the peripheral part of the high-voltage transistor 152. The provision of the dummy cell transistor 131' and the dummy peripheral transistors 151' and 153' makes it easy to maintain a constant planarity at the time of processing, for example, a high-quality finish in a chemical mechanical polishing (CMP) method within the surface of a wafer.

In addition, in an actual EEPROM, a plurality of memory cells 130 having the configuration described above are arranged in matrix (lattice) form to form a cell array having a predetermined memory capacity, and a desired logic circuit (peripheral circuit) is formed by the low- and high-voltage peripheral transistors 150 and 152.

Next, a method of manufacturing the EEPROM having the configuration described above will be briefly explained. It is to be noted that in the present example, processes which are not directly concerned with the configuration of the present embodiment are not described, such as an ion implantation process and a thermal process out of processes for forming the memory cell and the peripheral transistor.

Figure 22:
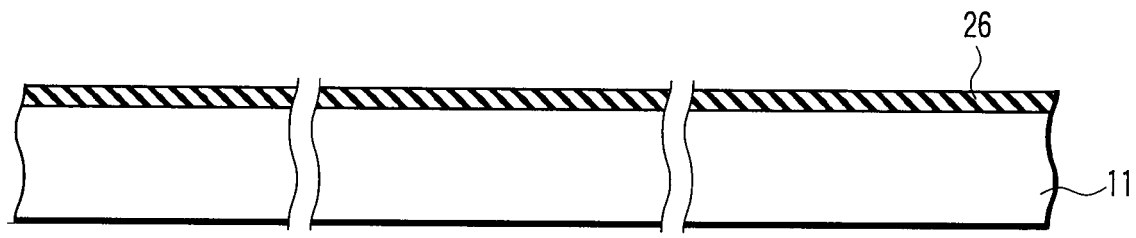
FIG. 22 is a process sectional view for explaining a method of manufacturing the EEPROM shown in FIG. 21.
Figure 23:
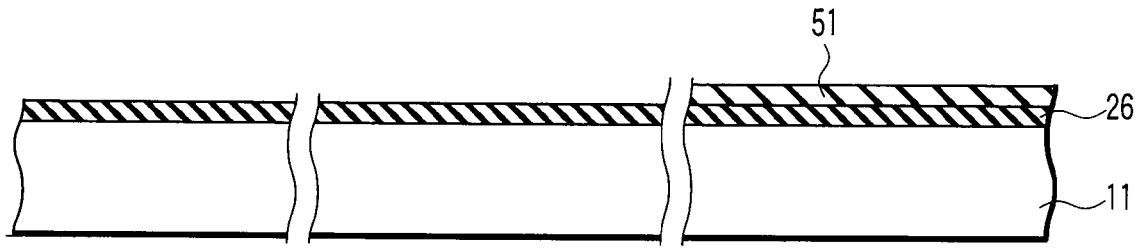
FIG. 23 is a process sectional view for explaining the method of manufacturing the EEPROM shown in FIG. 21.
Figure 24:
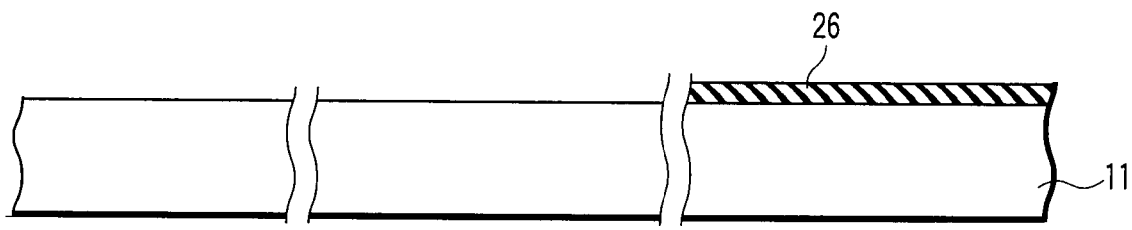
FIG. 24 is a process sectional view for explaining the method of manufacturing the EEPROM shown in FIG. 21.

First, the third insulating film 26 for forming the gate oxide film 152a of the high-voltage transistor 152 is formed on the entire surface of the semiconductor substrate 11 (see FIG. 22). Then, areas other than an area for forming the high-voltage transistor 152 and the dummy peripheral transistor 153' of the high-voltage transistor area 15b are opened by a lithographic process. That is, the high-voltage transistor area 15b for forming the high-voltage transistor 152 and the dummy peripheral transistor 153' alone is patterned with a resist 51 (see FIG. 23). Then, this resist 51 is used as a mask to remove the third insulating film 26 in other areas. Thus, after the third insulating film 26 is left in the high-voltage transistor area 15b for forming the high-voltage transistor 152 and the dummy peripheral transistor 153' alone, the resist 51 is removed (see FIG. 24).

Figure 25:
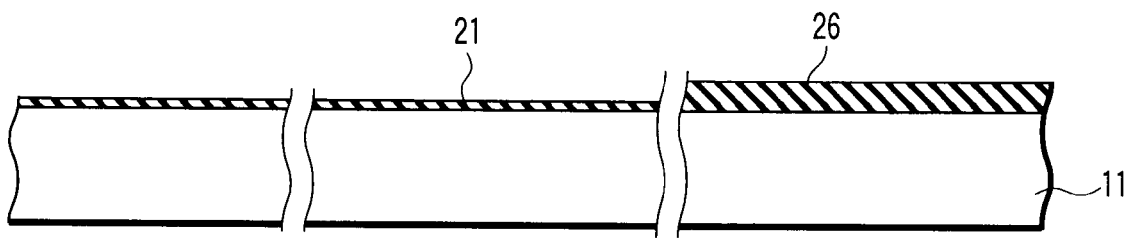
FIG. 25 is a process sectional view for explaining the method of manufacturing the EEPROM shown in FIG. 21.

Next, the first insulating film 21 is formed on the entire surface of the substrate 11 to form the tunnel oxide film 130a of the memory cell 130, the gate oxide film 131a of the dummy cell transistor 131', the gate oxide film 150a of the low-voltage transistor 150, and the gate oxide film 151a of the low-voltage dummy peripheral transistor 151' (see FIG. 25). The first insulating film 21 is formed to be thinner than the third insulating film 26 formed in the previous process.

Figure 26:
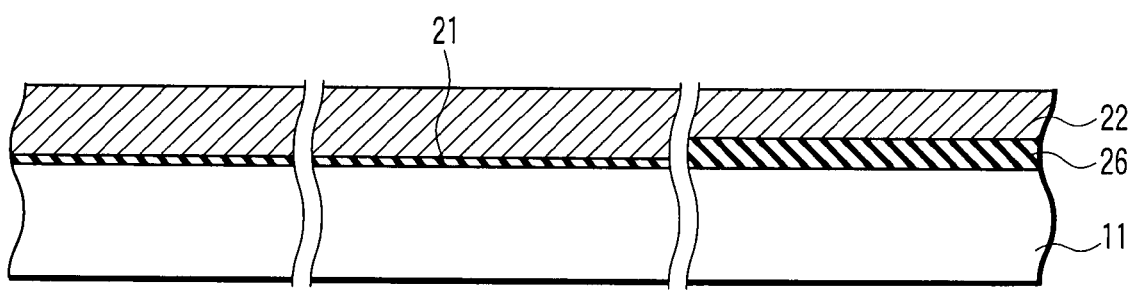
FIG. 26 is a process sectional view for explaining the method of manufacturing the EEPROM shown in FIG. 21.

Next, the first conductive film 22 made of polysilicon doped with impurities is formed on the entire surface of the substrate 11 via the first and third insulating films 21 and 26 so that the first conductive film 22 serves as the floating gate electrode 130b of the memory cell 130, the first dummy electrode 131b of the dummy cell transistor 131', the first gate electrode 150b of the low-voltage transistor 150, the first dummy electrode 151b of the low-voltage dummy peripheral transistor 151', the first gate electrode 152b of the high-voltage transistor 152, and the first dummy electrode 153b of the high-voltage dummy peripheral transistor 153' (see FIG. 26). On the top of the first conductive film 22, a silicon nitride (SiN) film 52 serving as a hard mask for processing is formed (see FIG. 27).

Next, the top of the SiN film 52 is patterned with a resist 53 for forming the element separation areas 35 by a lithographic process (see FIG. 28). Then, the SiN film 52 is selectively etched and removed using this resist 53 as a mask to form a hard mask 52a, and the resist 53 is then removed (see FIG. 29).

Figure 34:
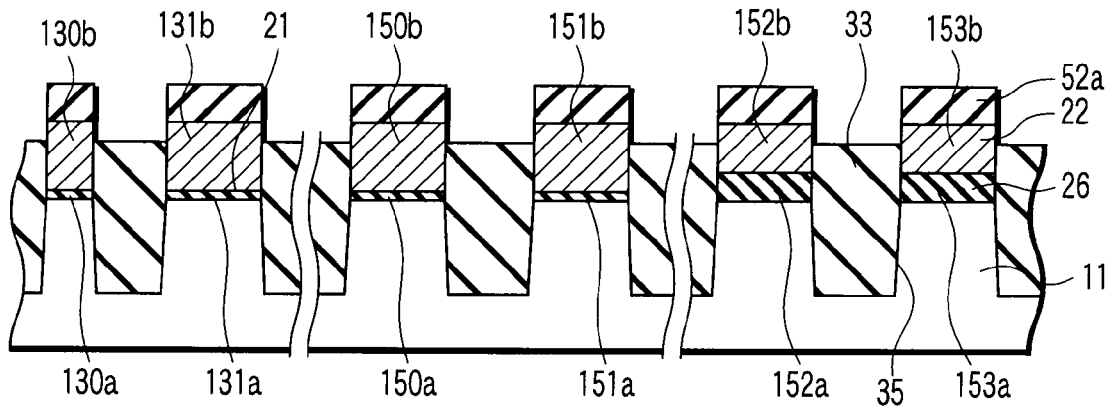
FIG. 34 is a process sectional view for explaining the method of manufacturing the EEPROM shown in FIG. 21.

Next, the first conductive film 22 and the first and third insulating films 21 and 26 are etched using the hard mask 52a (see FIG. 30), and the surface part of the substrate 11 is etched at a proper depth to form a groove 35a (see FIG. 31). Then, the element separation insulating film 33 is deposited on the entire surface of the substrate 11 to fill the groove 35a (see FIG. 32), and the surface of the element separation insulating film 33 is polished by, for example, a CMP method and planarized so that the element separation insulating film 33 is as high as the upper end of the hard mask 52a (see FIG. 33). Further, the element separation insulating film 33 is etched until the top of the first conductive film 22 projects (see FIG. 34), and then the hard mask 52a is removed.

In this manner, element areas are defined by the element separation areas 35 embedded with the element separation insulating film 33. Thus, the tunnel oxide film 130a and the floating gate electrode 130b of the memory cell 130, and the gate oxide film 131a and the first dummy electrode 131b of the dummy cell transistor 131' are formed in the element areas corresponding to the memory cell area 13. Further, the gate oxide film 150a and the first gate electrode 150b of the low-voltage transistor 150, and the gate oxide film 151a and the first dummy electrode 151b of the low-voltage dummy peripheral transistor 151' are formed in the element areas corresponding to the low-voltage transistor area 15a of the peripheral circuit area 15. Still further, the gate oxide film 152a and the first gate electrode 152b of the high-voltage transistor 152, and the gate oxide film 153a and the first dummy electrode 153b of the high-voltage dummy peripheral transistor 153' are formed in the element areas corresponding to the high-voltage transistor area 15b of the peripheral circuit area 15.

Figure 35:
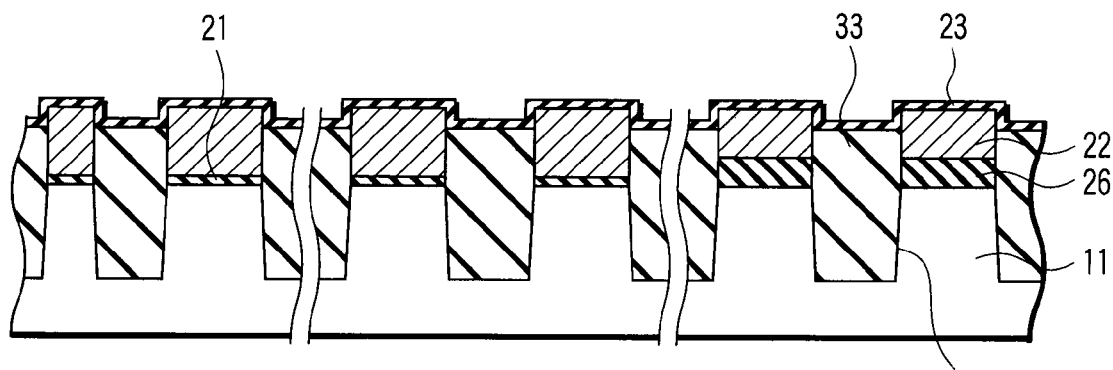
FIG. 35 is a process sectional view for explaining the method of manufacturing the EEPROM shown in FIG. 21.
Figure 36:
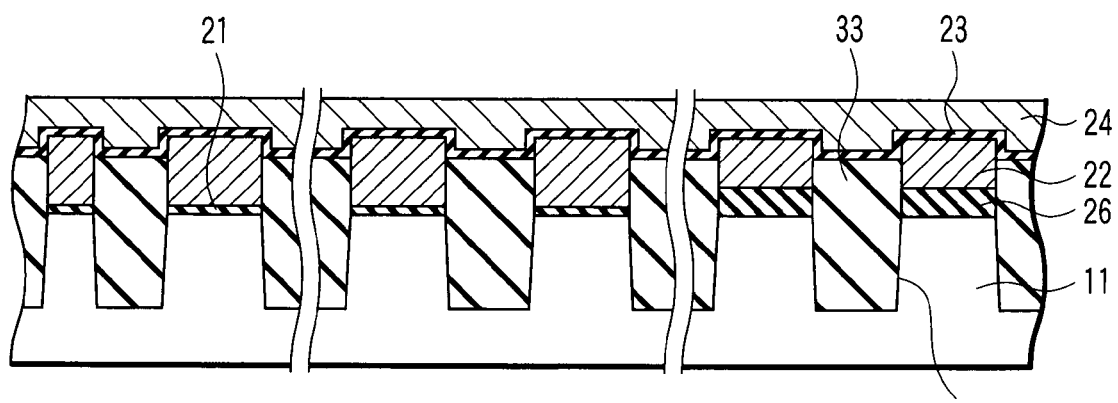
FIG. 36 is a process sectional view for explaining the method of manufacturing the EEPROM shown in FIG. 21.

Next, the second insulating film 23 for forming the interpoly insulating film 130c, etc., is formed on the entire surface of the substrate 11 (see FIG. 35), and then the second conductive film 24 made of polysilicon doped with impurities is formed (see FIG. 36).

Next, the second insulating film 23 is opened. The opening of the second insulating film 23 is targeted at the low-voltage transistor 150 and the high-voltage transistor 152 in the memory cell area 13 and the peripheral circuit area 15. That is, the top of the second conductive film 24 is patterned with the resist 53 by a lithographic process to cover areas other than areas for forming the low-voltage transistor 150 and the high-voltage transistor 152 (see FIG. 37). Then, the resist 53 is used as a mask to selectively etch parts of the second conductive film 24, the second insulating film 23 and the first conductive film 22, thereby forming an opening 54 (see FIG. 38).

Figure 40:
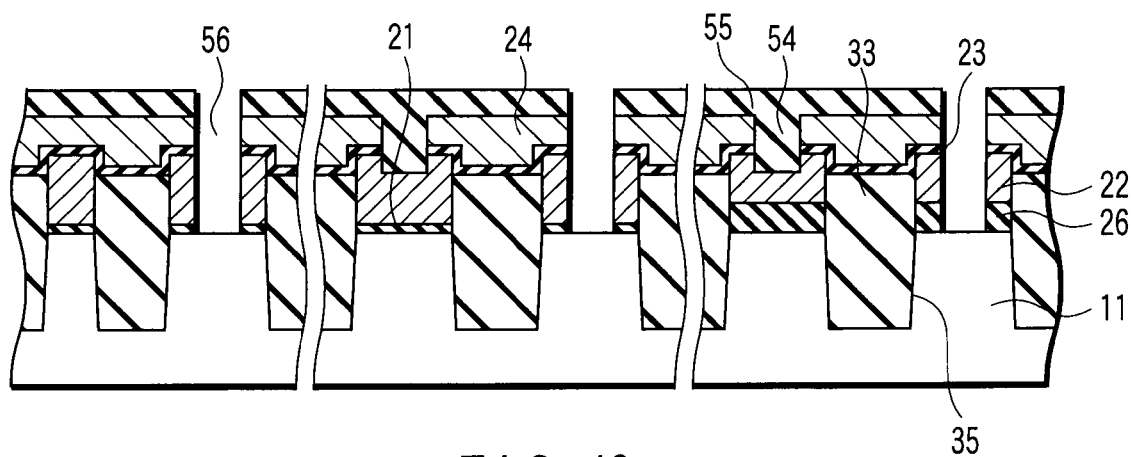
FIG. 40 is a process sectional view for explaining the method of manufacturing the EEPROM shown in FIG. 21.

Next, after the resist 53 is removed, the first and third insulating films 21 and 26 are opened. The opening of the first and third insulating films 21 and 26 is targeted at all the dummy transistor elements, that is, the dummy cell transistor 131', the low-voltage dummy peripheral transistor 151' and the high-voltage dummy peripheral transistor 153' in the memory cell area 13 and the peripheral circuit area 15. That is, the top of the second conductive film 24 is patterned with a resist 55 by a lithographic process to cover areas for forming the dummy cell transistor 131', the low-voltage dummy peripheral transistor 151' and the high-voltage dummy peripheral transistor 153' (see FIG. 39). Then, the resist 55 is used as a mask to selectively etch the second conductive film 24, the second insulating film 23, the first conductive film 22, and the first and third insulating films 21 and 26, thereby forming an opening 56 (see FIG. 40).

Figure 41:
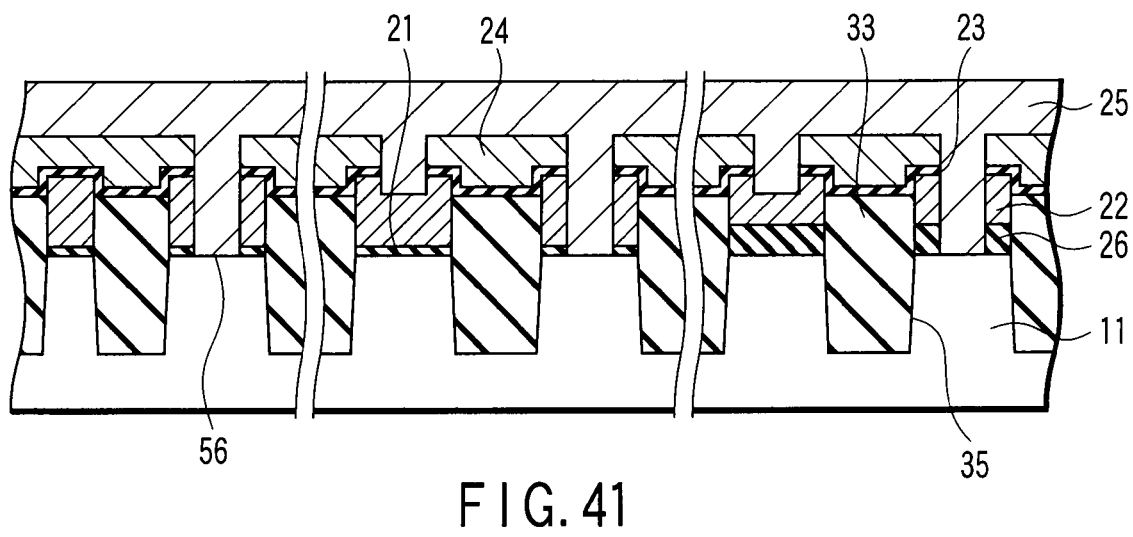
FIG. 41 is a process sectional view for explaining the method of manufacturing the EEPROM shown in FIG. 21.

Next, after the resist 55 is removed, the third conductive film 25 made of polysilicon doped with impurities is formed on the entire surface of the substrate 11 (see FIG. 41). Then, the third conductive film 25 is patterned so that the third conductive film 25 is electrically connected to the first conductive film 22 formed of the second conductive film 24 for the low-voltage transistor 150 and the high-voltage transistor 152. For the dummy cell transistor 131', the low-voltage dummy peripheral transistor 151' and the high-voltage dummy peripheral transistor 153', the third conductive film 25 is electrically connected to the substrate 11 formed of the first and second conductive films 22 and 24.

Next, the silicon nitride film (not shown) for patterning remaining on the surface of the third conductive film 25 is removed by dry etching, and then polysilicon is caused to react with a metal to form the silicide layer 30 on the surface of the third conductive film 25. During this etching, most of the charge which has entered exposed polysilicon subjected to plasma escapes to the semiconductor substrate 11 via the current leakage path LPa' of the dummy cell transistor 131' and the current leakage paths LPb' and LPc' of the low- and high-voltage dummy peripheral transistors 151' and 153' without being trapped in the interpoly insulating film 130c of the memory cell 130 and in the gate oxide films 150a and 152a of the low- and high-voltage transistors 150 and 152. It is therefore possible to reduce a plasma damage (charge-up attributed to the dry etching) in which the threshold values of the memory cell 130 and the low- and high-voltage transistors 150 and 152 vary due to a variation of a threshold value corresponding to the charge trapped during the dry etching leading to a decrease in the reliability of the EEPROM.

Thereafter, the interlayer insulating film 31 is formed on the entire surface of the substrate 11 including the top of the silicide layer 30. Then, the surface of the interlayer insulating film 31 is planarized by the CMP method, such that the EEPROM having the structure shown in FIG. 21 can be obtained.

As described above, the current leakage paths LPa', LPb' and LPc' directly linked to the substrate 11 are formed in the dummy cell transistor 131' and the low- and high-voltage dummy peripheral transistors 151' and 153'. Thus, the plasma damage to the memory cell 130 and the low- and high-voltage transistors 150 and 152 during the dry etching can be reduced, and the variation of the threshold value due to the plasma damage can be suppressed.

Especially, in the EEPROM using silicide for the control gate electrodes 130d and 130e of the memory cell 130, a current runs to the dummy cell transistor 131' and the low- and high-voltage dummy peripheral transistors 151' and 153', so that voltages applied to the interpoly insulating film 130c of the memory cell 130 and to the gate oxide films 150a and 152a of the low- and high-voltage transistors 150 and 152 can be decreased during the dry etching. As a result, it is possible to reduce the charge trapped in the interpoly insulating film 130c of the memory cell 130 and in the gate oxide films 150a and 152a of the low- and high-voltage transistors 150 and 152. Therefore, it is possible to reduce the variations of the threshold values of the memory cell 130 and the low- and high-voltage transistors 150 and 152 corresponding to the trapped charge and to improve the reliability of the memory cell 130 and the low- and high-voltage transistors 150 and 152.

Moreover, in the present embodiment, the gate oxide films 131a, 151a and 153a are opened in the dummy cell transistor 131' and the low- and high-voltage dummy peripheral transistors 151' and 153'. Therefore, the dummy resistance can be lower than that in the EEPROM having the configuration shown in the first embodiment, regardless of the thickness of the gate oxide film 153a. It is thus possible to further reduce the charge trapped in the interpoly insulating film 130c of the memory cell 130 and in the gate oxide films 150a and 152a of the low- and high-voltage transistors 150 and 152.

In addition, the case has been explained as an example in the second embodiment described above where the first and third insulating films 21 and 26 are opened together with the second insulating film 23 in the process after the second insulating film 23 has been opened. The present invention is not limited to this, and the order of opening may be reversed. That is, the opening 54 may be formed in the process after the opening 56 has been formed. Further, the second insulating film 23 in all the transistor elements except for the memory cell 130 may be first opened, and then the low-voltage transistor 150 and the high-voltage transistor 152 may be covered with masks, and the first insulating film 21 in the dummy cell transistor 131' and the low-voltage dummy peripheral transistor 151', and the third insulating film 26 in the high-voltage dummy peripheral transistor 153' may be opened at a time.

Furthermore, any of the embodiments is not limited to the case of ensuring the conductivity of the dummy cell transistor and the conductivity of the low- and high-voltage dummy peripheral transistors. For example, sufficient effects can be also obtained when at least the current leakage path LPc, LPc' is only formed so that the conductivity of the high-voltage dummy peripheral transistor alone can be ensured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor storage device comprising:
a semiconductor substrate including a memory cell region and a peripheral circuit region;
a first insulating film formed on the semiconductor substrate in the memory cell region;
a memory cell transistor formed on the semiconductor substrate in the memory cell region, including a first conductive film formed on the first insulating film, a second insulating film formed on the first conductive film, and a second conductive film formed on the second insulating film, the second conductive film having a first silicide film;
a dummy cell transistor formed on the semiconductor substrate in the memory cell region, including a third conductive film formed on the first insulating film, a third insulating film formed on the third conductive film, and a fourth conductive film formed on the third insulating film, the fourth conductive film having a second silicide film and contacting with the third conductive film by penetrating the third insulating film;
a fourth insulating film formed on the semiconductor substrate in the peripheral circuit region;
a peripheral transistor formed on the semiconductor substrate in the peripheral circuit region and including a fifth conductive film formed on the fourth insulating film, a fifth insulating film formed on the fifth conductive film, and a sixth conductive film formed on the fifth insulating film, the sixth conductive film having a third silicide film and contacting with the fifth conductive film by penetrating the fifth insulating film;
a sixth insulating film formed on the semiconductor substrate in the peripheral circuit region; and
a dummy peripheral transistor formed on the semiconductor substrate in the peripheral circuit region, including a seventh conductive film formed on the sixth insulating film, a seventh insulating film formed on the seventh conductive film, and an eighth conductive film formed on the seventh insulating film, the eighth conductive film contacting with the seventh conductive film by penetrating the seventh insulating film, wherein a thickness of the fourth insulating film is larger than a thickness of the sixth insulating film.

2. The nonvolatile semiconductor storage device according to claim 1, wherein the first, second, third, fourth, fifth, sixth, seventh and eighth conductive films include a polysilicon film, respectively.

3. The nonvolatile semiconductor storage device according to claim 1, wherein the first silicide film located at an upper end of the second conductive film, the second silicide film is located at an upper end of the fourth conductive film, and the third silicide film is located at an upper end of the sixth conductive film.

4. The nonvolatile semiconductor storage device according to claim 1, wherein a height of a lower end portion of the fourth conductive film is lower than a height of an upper end portion of the third conductive film relative to an upper surface of the semiconductor substrate.

5. The nonvolatile semiconductor storage device according to claim 1, wherein the dummy cell transistor is located adjacent to the memory cell transistor.

6. The nonvolatile semiconductor storage device according to claim 1, wherein a thickness of the first insulating film is same as a thickness of the sixth insulating film.

7. The nonvolatile semiconductor storage device according to claim 1, wherein the peripheral transistor is high-voltage transistor.

8. The nonvolatile semiconductor storage device according to claim 1, wherein the dummy peripheral transistor is located adjacent to the peripheral transistor.

9. The nonvolatile semiconductor storage device according to claim 1, wherein the eighth conductive film includes a fourth silicide film.

10. The nonvolatile semiconductor storage device according to claim 9, wherein the fourth silicide film is located at an end portion of the eight conductive film.

11. A nonvolatile semiconductor storage device, comprising:
- a semiconductor substrate including a memory cell region, a first peripheral circuit region and a second peripheral circuit region;
- a first insulating film formed on the semiconductor substrate in the memory cell region;
- a second insulating film formed on the semiconductor substrate in the first peripheral circuit region, a thickness of the second insulating film being larger than a thickness of the first insulating film;
- a third insulating film formed on the semiconductor substrate in the second peripheral circuit region, a thickness of the third insulating film being same as the thickness of the first insulating film;
- a memory cell transistor formed on the semiconductor substrate in the memory cell region, including a first conductive film formed on the first insulating film, a fourth insulating film formed on the first conductive film and a second conductive film formed on the fourth insulating film, the second conductive film having a first silicide film;
- a first dummy transistor formed on the semiconductor substrate in the memory cell region, including a third conductive film formed on the first insulating film, a fifth insulating film formed on the third conductive film and a fourth conductive film formed on the fifth insulating film, the fourth conductive film having a second silicide film and contacting with the third conductive film by penetrating the fifth insulating film;
- a high-voltage peripheral transistor formed on the semiconductor substrate in the first peripheral circuit region, including a fifth conductive film formed on the second insulating film, a sixth insulating film formed on the fifth conductive film, and a sixth conductive film formed on the sixth insulating film, the sixth conductive film having a third silicide film and contacting with the fifth conductive film by penetrating the sixth insulating film;
- a second dummy transistor formed on the semiconductor substrate in the first peripheral circuit region, including a seventh conductive film formed on a tenth insulating film, a seventh insulating film formed on the seventh conductive film, and an eighth conductive film formed on the seventh insulating film, the eighth conductive film having a fourth silicide film and contacting with the seventh conductive film by penetrating the seventh insulating film;
- a low-voltage peripheral transistor formed on the semiconductor substrate in the second peripheral circuit region, including a ninth conductive film formed on the third insulating film, an eighth insulating film formed on the ninth conductive film, and a tenth conductive film formed on the eighth insulating film, the tenth conductive film having a fifth silicide film and contacting with the ninth conductive film by penetrating the eighth insulating film; and
- a third dummy transistor formed on the semiconductor substrate in the second peripheral circuit region, including an eleventh conductive film formed on the third insulating film, a ninth insulating film formed on the eleventh conductive film, and a twelfth conductive film formed on the ninth insulating film, the twelfth conductive film having a sixth silicide film and contacting with the eleventh conductive film by penetrating the ninth insulating film.

* * * * *